(12) United States Patent
Lu et al.

(10) Patent No.: US 10,498,339 B2
(45) Date of Patent: Dec. 3, 2019

(54) HOLD-TIME COMPENSATION USING FREE METAL SEGMENTS

(71) Applicant: MediaTek Inc., Hsinchu (TW)

(72) Inventors: Chien-Pang Lu, Hsinchu County (TW); Yu-Tung Chang, Hsinchu (TW); Yu-Ming Yang, New Taipei (TW)

(73) Assignee: MEDIATEK INC., Hsinchu (TW)

( * ) Notice: Subject to any disclaimer, the term of this patent is extended or adjusted under 35 U.S.C. 154(b) by 6 days.

(21) Appl. No.: 15/919,896

(22) Filed: Mar. 13, 2018

(65) Prior Publication Data

US 2018/0278253 A1    Sep. 27, 2018

Related U.S. Application Data

(60) Provisional application No. 62/476,937, filed on Mar. 27, 2017.

(51) Int. Cl.
| | |
|---|---|
| H03K 19/096 | (2006.01) |
| G06F 17/50 | (2006.01) |
| H01L 27/02 | (2006.01) |
| H03K 19/00 | (2006.01) |
| H03K 5/135 | (2006.01) |
| H03K 19/003 | (2006.01) |

(52) U.S. Cl.
CPC ....... *H03K 19/096* (2013.01); *G06F 17/5081* (2013.01); *H01L 27/0207* (2013.01); *H03K 5/135* (2013.01); *H03K 19/0013* (2013.01); *H03K 19/0016* (2013.01); *H03K 19/00323* (2013.01)

(58) Field of Classification Search
None
See application file for complete search history.

(56) References Cited

U.S. PATENT DOCUMENTS

| | | | |
|---|---|---|---|
| 6,177,807 B1 * | 1/2001 | Bertin | G06F 13/4086 326/26 |
| 6,675,364 B1 * | 1/2004 | Basto | G01R 31/318342 716/108 |
| 7,312,631 B1 | 12/2007 | Bauer et al. | |
| 8,159,266 B1 * | 4/2012 | Madurawe | H01L 27/0207 326/101 |
| 9,767,239 B1 * | 9/2017 | Buck | G06F 17/5081 |

(Continued)

OTHER PUBLICATIONS

European Patent Office, Extended European Search Report for European Patent Application No. 18163984.0, dated Jul. 26, 2018.

*Primary Examiner* — Minh D A
*Assistant Examiner* — James H Cho
(74) *Attorney, Agent, or Firm* — Han IP PLLC; Andy M. Han

(57) ABSTRACT

Methods and apparatuses pertaining to hold-time compensation using free metal segments or other electrically-conductive segments of an IC are described. An integrated circuit (IC) having free segment hold-time compensation may include a monolithic semiconductor substrate which has a first device and a second device disposed thereon. In addition, the IC may include an electrical node electrically connecting the first and second devices. The electrical node may include one or more electrically-conductive elements that contribute to a total capacitance at the electrical node such that the total capacitance at the electrical node has a value that fulfills a hold-time requirement at the electrical node.

11 Claims, 11 Drawing Sheets

(56) References Cited

U.S. PATENT DOCUMENTS

| | | |
|---|---|---|
| 2011/0084726 A1 | 4/2011 | Habel et al. |
| 2011/0239069 A1* | 9/2011 | Ramaraju ............. G06F 11/267 |
| | | 714/731 |
| 2013/0104092 A1* | 4/2013 | Buck ................... G06F 17/5031 |
| | | 716/113 |
| 2014/0368247 A1 | 12/2014 | Datta et al. |
| 2016/0283643 A1* | 9/2016 | Kim .................... G06F 17/5081 |

\* cited by examiner

HOLD-TIME COMPENSATION USING FREE METAL SEGMENTS

CROSS REFERENCE TO RELATED PATENT APPLICATION(S)

The present disclosure claims the priority benefit of U.S. Patent Application No. 62/476,937, filed on 27 Mar. 2017, the content of which is incorporated by reference in its entirety.

TECHNICAL FIELD

The present disclosure is generally related to digital integrated circuit (IC) design and, more particularly, to timing closure techniques using free metal segments.

BACKGROUND

Unless otherwise indicated herein, approaches described in this section are not prior art to the claims listed below and are not admitted as prior art by inclusion in this section.

For digital and mixed-signal integrated circuit (IC) design, such as those of very-large-scale integrated (VLSI) circuits or systems fabricated on one or more monolithic semiconductor substrates, it is imperative that timing requirements or constraints are fulfilled among sequential logic gates such that the circuit or system may function as intended by the design. In general, the timing requirements may include various setup time, hold-time and transition (e.g., slew rate) criteria to be met at either an input or output terminal of sequential logic gates of the IC. In a contemporary IC design flow, the timing requirements are addressed at a later stage of the flow, after the logic gates of the IC are synthesized. A dedicated software tool is usually employed to check whether all timing requirements are met within the IC design. The software tool may further tweak or otherwise fine tune the design to correct any timing violations that are found within the design (i.e., "fix the timing" or "close the timing").

A conventional approach taken by a timing closure tool or software to fix a hold-time violation is to insert one or more buffers in a data path as delay such that the data may be properly fetched or latched by a sequential-logic device of the IC. This approach, however, is susceptible to various disadvantages, including increased area and leakage power due to the added buffers, as well as potential difficulty of signal routing or rerouting especially in routing congestion areas. In addition, the amount of delay added may be less controlled or predictable due to discrete nature of the buffers and delay variation induced by process, voltage, or temperature (PVT) parameter changes when the IC is fabricated or in operation.

The negative impact to the operation of the IC caused by the disadvantages of the conventional approach stated above can be significant. For example, in a benchmark IC design roughly having 2 million logic instances, it may require a number of close to fifty thousand buffers to be added at the timing fixing stage of the IC design flow to fix the hold-time violations of the IC using the conventional approach, contributing to a 5% increase in silicon area. The accompanying increase of leakage power is also significant. The added leakage power is especially disadvantageous to power sensitive applications such as cellular handsets, tablet computers or other mobile devices.

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An objective of the present disclosure is to propose solutions or schemes that address the aforementioned disadvantages of the conventional approach. Under a proposed scheme, a hold-time violating net or electrical node of an IC may be addressed by having one or more free metal segments or other electrically-conductive segments attached to the hold-time violating net in a form of one or more compensation stubs. Each of the one or more compensation stubs may contribute an extra delay at the electrical node to fix the hold-time violation.

In one aspect, an IC having free segment hold-time compensation may include a monolithic semiconductor substrate which has a first device and a second device disposed thereon. In addition, the IC may include an electrical node electrically connecting the first and second devices. The electrical node may include one or more electrically-conductive elements that contribute to a total capacitance at the electrical node such that the total capacitance at the electrical node has a value that fulfills a hold-time requirement at the electrical node. The electrically-conductive elements may include a first subset and a second subset. The first subset of the electrically-conductive elements may form a primary wiring that electrically couples the first device to the second device. The primary wiring may have a first end connected to an output terminal of the first device and a second end connected to an input terminal of the second device. The second subset of the electrically-conductive elements may include one or more compensation stubs. Each of the compensation stubs may have a fixed end and a free end. A compensation stub may be electrically coupled to the primary wiring of the electrical node through its fixed end. The free end of the compensation stub is not electrically coupled to any electrical node of the IC other than the electrical node.

In another aspect, a method is presented for conducting a digital signal from a first sequential-logic device of an IC to a second sequential-logic device of the IC while fulfilling a hold-time requirement at an input terminal of the sequential-logic device. The method may involve the first sequential-logic device generating the digital signal, which may have at least one logic transition. The method may also involve one or more delay elements, which may be disposed between the first and second sequential-logic devices of the IC, conducting the digital signal from the first sequential-logic device to the second sequential-logic device with a delay of a predetermined amount of time. The delay may enable the at least one logic transition of the digital signal to comply with the hold-time requirement when the digital signal arrives at the input terminal of the second sequential-logic device. The one or more delay elements may include a passive delay element that includes an electrically-conductive primary wiring and at least one electrically-conductive compensation stub. The primary wiring may carry the digital signal from the first sequential-logic device to the second sequential-logic device. The at least one electrically-conductive compensation stub may extend from the primary wiring and terminate in a metal layer of the IC without connecting to an active device of the IC.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview of Hold-Time Violation

As mentioned above, timing closure optimizes an IC design to satisfy various timing constraints. For example, setup time optimization aims to achieve a target working frequency, while hold-time fixing, or compensation, is intended to avoid latching incorrect data from short paths (e.g., double clocking). Unlike setup time violations, which may be resolved by reducing the frequency, hold-time violations in a silicon chip would be detrimental to the operation of the IC. Furthermore, since timing is required to be more accurate as semiconductor processing technology progresses toward ever smaller feature sizes, a hold-time repair performed at an early stage of the IC design flow might become less than sufficient at a later stage of the design flow. Consequently, hold-time compensation constitutes an essential task in the design flow, and typically serves as the final step of timing closure. In this later stage of the design flow, circuits would have been synthesized, automatic place and route (APR) would have been performed, and setup time optimization would have already been applied, leaving limited and fragmented spaces for hold-time compensation. This makes fixing or compensating the hold-time violations without impacting circuit performance an even more challenging task.

Figure 1:
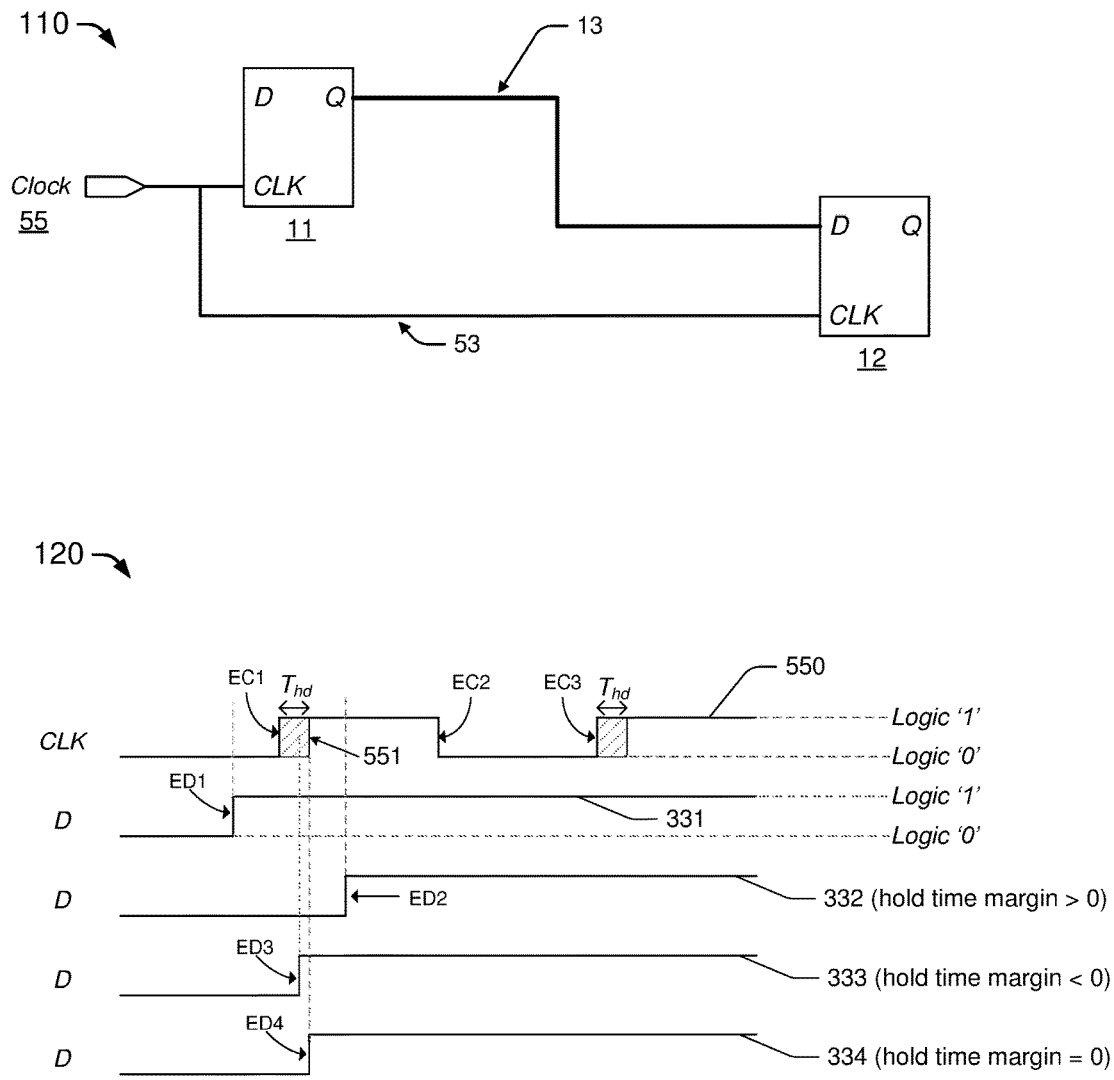
FIG. 1 is a diagram depicting an example IC that may have a hold-time violation.

A possible hold-time violation may be illustrated using FIG. 1, which shows an example circuit, IC 110, as an embodiment of the present disclosure. In FIG. 1, IC 110 includes two sequential-logic devices 11 and 12, both of which may be fabricated on a monolithic semiconductor substrate using a typical IC fabrication technology or process. A sequential-logic device may be a flip-flop or a latch that is commonly used in a state machine or a memory circuit of a digital or mixed-signal system. The sequential-logic devices 11 and 12 of FIG. 1, in particular, are D flip-flops, each having an input terminal D and an output terminal Q. Each of sequential-logic devices 11 and 12 also has a clock terminal CLK receiving a clock signal 55 which synchronizes D flip-flops 11 and 12. IC 110 also includes a "net" or an electrical node 13 that electrically connects or couples the D flip-flops 11 and 12 to one another. The terms "net" and "electrical node" are used interchangeably in the present disclosure. Particularly, electrical node 13 connects the Q terminal of D flip-flop 11 to the D terminal of D flip-flop 12. From a circuitry point of view, net 13 may be viewed as a "data path", as it carries, during the operation of IC 110, a time-varying digital signal (the "data") from the terminal Q of D flip-flop 11 to the D terminal of D flip-flop 12.

Certain timing requirements of the data and the clock signal need to be met for IC 110 to operate properly as it is designed, with one of the timing requirements being a hold-time requirement at the D terminal of D flip-flop 12. Referring to timing diagram 120 of FIG. 1, clock signal 55 arriving at the CLK terminal of D flip-flop 12 on clock path 53, as shown in IC 110, may have one or more logic transitions, such as positive transitions or edges EC1 and EC3 as well as negative transition or edge EC2 of clock waveform 550. A positive edge is defined as a transition of a voltage from a logic '0' level to a logic '1' level, while a negative edge is defined as a transition of a voltage from a logic '1' level to a logic '0' level. Similarly, the data arriving at the D terminal of D flip-flop 12 on the data path formed by net 13 also has one or more logic transitions, such as positive transitions or edges ED1, ED2, ED3 and ED4 of data waveform 331, 332, 333 and 334, respectively. The hold-time requirement at the D terminal of D flip-flop 12 demands a certain temporal relationship between a data transition and a clock transition. Namely, the hold-time requirement demands a logic transition or edge (either positive or negative) of the data arriving at the D terminal of D flip-flop 12 (i.e., the "data transition") and a logic transition or edge of clock signal 55 arriving at the CLK terminal of D flip-flop 12 (i.e., the "clock transition").

Specifically, assuming that D flip-flop 12 is a positively-trigged flip-flop (e.g., D flip-flop 12 operates upon an arrival of a positive edge at its CLK terminal, and disregards a negative edge at its CLK terminal), the hold-time requirement demands that net 13 should have an unchanged logic state (i.e., remaining at either logic '1' or logic '0') within a time window of a certain length, referred as "hold time" and "hold-time" and denoted by $T_{hd}$ in timing diagram 120, immediately after a positive edge arriving at terminal CLK of D flip-flop 12. A hold-time violation occurs if a data transition happens during the hold-time windows represented by the two shaded blocks in timing diagram 120. Each of data waveforms 331, 332, 333 and 334 represents a possible waveform of a digital signal conducted by net 13 at the D terminal of D flip-flop 12. Each of waveforms 331, 332 and 334 does fulfill the hold-time requirement at net 13, because each of the data transitions ED1, ED2 and ED4 occurs outside the forbidden hold-time windows denoted by $T_{hd}$ in timing diagram 120. On the other hand, there is a hold-time violation in waveform 333, as data transition ED3 occurs after clock transition EC1 by less than a temporal length of the hold time $T_{hd}$, thus failing to fulfill the hold-time requirement.

Waveform 332 has a positive hold-time margin, as data transition ED2 happens after the ending (denoted by numeral 551 in timing diagram 120) of the hold time following clock transition EC1. Waveform 334 has a zero hold-time margin, as data transition ED4 happens substantially at the same time as the ending 551 of the hold time following clock transition EC1. Waveform 333 has a negative hold-time margin, as data transition ED3 happens before the ending 551. The hold-time margin is typically measured in time, represented by the temporal difference between the ending 551 of the hold time at the CLK terminal and the data transition (i.e., ED2, ED3 or ED4) at the D terminal. Clearly, a negative hold-time margin is not permitted in the IC, since it fails to meet the hold-time requirement. The present disclosure proposes a novel way to "fix the hold time" such that a hold-time margin may be changed or otherwise "compensated" from a negative value to zero or a positive value, thereby fulfilling the hold-time requirement. This timing closure process of fulfilling an otherwise failed hold-time requirement by compensating the hold-time margin from a negative value to a zero or positive value is what is referred as the "hold-time compensation".

In some embodiments, D flip-flop 12 may be a negatively-triggered flip-flop, (e.g., D flip-flop 12 operates upon an arrival of a negative edge at its CLK terminal, and disregards a positive edge at its CLK terminal), and the hold-time requirement would then demand that net 13 should have an unchanged logic state within the time window (i.e., the "hold time") immediately after a negative edge arriving at terminal CLK of D flip-flop 12.

It is to be noted that it is not necessary to have two sequential-logic devices to receive a same clock signal for the two sequential-logic devices to operate in synchronization, or to be "clocked in synchronization". The two sequential-logic devices are said to be clocked in synchronization as long as the clock signals they receive at their respective CLK terminals are temporally related with one another (e.g., derived from a same clock signal). For example, a divide-by-two clock divider (now shown in FIG. 1) may be placed in clock path 53 to have clock signal 55 divided down by a factor of two in frequency before entering the CLK terminal of sequential-logic device 12. That is, with the divide-by-two clock divider presented, sequential-logic device 12 would receive a half-rate clock signal as compared to the clock signal received by sequential-logic device 11. Nevertheless, sequential-logic devices 11 and 12 would still be said to be clocked in synchronization, as the clock signals received at the respective CLK terminals are still temporally related, both derived from clock signal 55.

Physically, net 13 consists of one or more electrically-conductive elements of the IC. Typically, an IC fabrication technology or process realizes an IC using a plurality of layers of various kinds of material, of which some layers are made of electrically-conductive material(s). The electrically-conductive layers may include metal layers such as, for example, metal 1 layer ("M1 layer"), metal 2 layer ("M2 layer"), metal 3 layer ("M3 layer"), metal 4 layer ("M4 layer"), metal 5 layer ("M5 layer") and metal 6 layer ("M6 layer"). The electrically-conductive layers may also include one or more polysilicon layers. Net 13 may be realized using any combination of the electrically-conductive layers. The plurality of layers are disposed on the monolithic semiconductor substrate on which the IC is formed in a layer-after-layer fashion. That is, the layers are disposed one layer on top of another, one layer at a time, and substantially parallel to each other and to the primary planar plane of the monolithic substrate. Depending on the specific IC fabrication technology used, an electrically-conductive element of the IC may include one or more metal segments disposed on one or more metal layers of the IC, one or more polysilicon segments disposed on one or more polysilicon layers of the IC, and/or other electrically-conductive materials available in the IC fabrication technology.

In the case where net 13 uses metal segments and/or polysilicon segments on more than one layer of the IC, vias or stacked vias are used to electrically connect the various metal and/or polysilicon segments together. A via is an electrical connection between two adjacent metal and/or polysilicon layers, while a stacked via includes several vias stacked on top of each other to form a vertical electrical connection between two electrically-conductive layers of the IC, one of which is more than one layer above or below the other. For example, a single via between M2 layer and M3 layer of the IC may be sufficient to electrically connect a metal segment on M2 layer to a metal segment on M3 layer. On the other hand, a stacked via consisting of three different vias (e.g., a first via between M2 and M3 layers, a second via between M3 and M4 layers, and a third via between M4 and M5 layers) stacked up in the vertical direction may be needed to electrically connect a metal segment on M2 layer to a metal segment on M5 layer.

Hold-Time Compensation Using Delay Elements

A hold-time violation may be fixed, or "compensated for", by so-called "delay padding" or "buffer insertion", namely, by adding delay in a short data path. A short data path is a path of a digital signal in the IC on which data carried in the digital signal arrives early with respect to a clock signal, such as waveform 333 of FIG. 1). For example, suppose waveform 333 of FIG. 1 represents the data on net 13 as the data arrives at the D terminal of D flip-flop 12. As explained above, the hold-time requirement fails to be met, and thus net 13 is a short data path that needs to be fixed with some delay added to net 13. With delay added to net 13, the digital signal being conducted or otherwise transmitted from D flip-flop 11 to D flip-flop 12 may be shifted in time, thus arriving at the input terminal D of D flip-flop 12 not as waveform 333 but as waveform 334 or waveform 332, thereby complying with the hold-time requirement at the input terminal D of D flip-flop 12.

Figure 2:
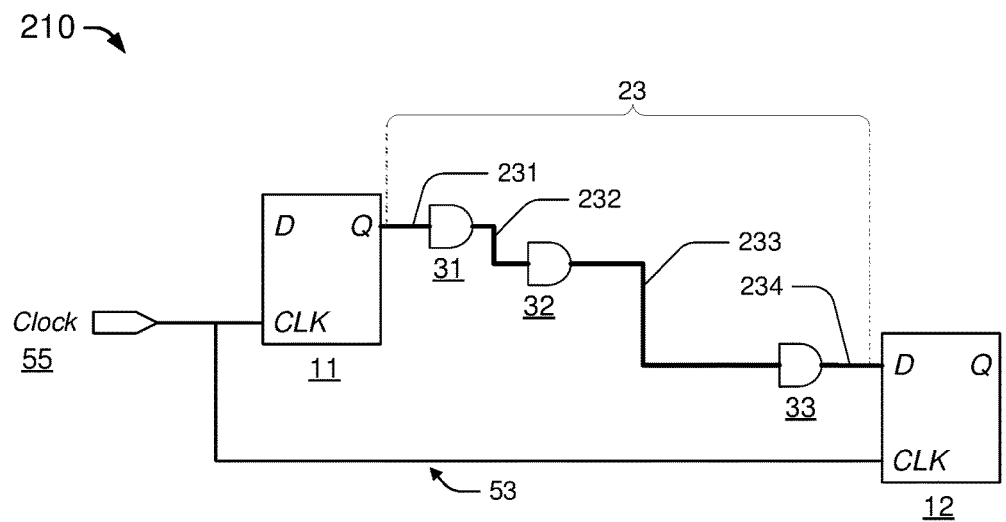
FIG. 2 is a diagram depicting an example IC and a short data path thereof.

In some embodiments, such as IC 210 of FIG. 2, a short data path between two sequential-logic devices may include one or more combinational-logic gates or devices. As shown in FIG. 2, data path 23 of IC 210 includes combinational-logic gates 31, 32 and 33, along with electrical nodes or nets 231, 232, 233 and 234. A data signal arriving at the D terminal of sequential-logic device 12 of FIG. 2 may have waveform 333 of FIG. 1, while a clock signal arriving at the CLK terminal of sequential-logic device 12 of FIG. 2 may have waveform 550 of FIG. 1. Therefore, data path 23 of FIG. 2 may constitute a short data path of IC 210, and a hold-time violation may be observed at the D terminal of sequential-logic device 12 of FIG. 2. Similar to how the hold-time violation at the D terminal of D flip-flop 12 of FIG. 1 may be fixed by adding one or more delay elements to net 13 of IC 110, the hold-time violation at the D terminal of D flip-flop 12 of FIG. 2 may be fixed by adding one or more delay elements to one or more of nets 231, 232, 233 and 234 of data path 23.

One way of adding delay to a short data path is by inserting one or more active delay elements, such as one or more inverters and/or one or more buffers connected in series, that behave as delay elements in the short data path. Referred as "active delay elements" (because the delay elements consist of active semiconductor devices such as transistors that actively consume current), the inverters and/or buffers connected in series provide additional propagation delay to data or the digital signal propagating down the short data path. The digital signal may thus be delayed and would not arrive at the next stage (e.g., D flip-flop 12 of FIG. 1) so much early with respect to the clock signal. As mentioned above, various disadvantages exist for using only active delay elements such as inverters or buffers to fix hold-time violations. Specifically, active delay elements may occupy significant silicon area, which is especially scarce at the later stage of the design flow and may also result in a higher power leakage. Both chip size (i.e., silicon area taken by the IC) and power consumption (i.e., electrical current consumed by the IC) are crucial factors from a system design perspective, in particular for mobile or portable applications. Also, buffers may magnify delay variations across different PVT corners, especially for advanced technology nodes having small feature sizes. For example, for a semiconductor fabrication technology node of 28 nanometers (nm) or below, the inserted buffers may increase path depths and thus the on-chip variation derating factor. Moreover, the inserted buffers may impact the metal routability (which leads to unpredictable wire delays) and area utilization of a design in a negative way.

Another critical disadvantage of active delay elements is that inverters by nature provide discrete amount of delays, making it hard to fix small hold-time violations, such as those below 5 or 10 picoseconds (ps). While it may be easy to provide a larger delay (e.g., 10-200 ps or above) through an inverter or a chain of inverters connected in series, it is difficult for an inverter to provide reliable delay in the range of 10 ps or below. In a contemporary VLSI circuit or system, however, instances of hold-time violations below 5 or 10 ps are numerous and typically take a large percentage of all hold-time violations. Fixing those small hold-time violations by using solely active delay elements usually requires significant silicon area, as well as many iterations in the timing closure phase of the design flow.

Free Metal Segments as Delay Elements

The disadvantages of fixing hold-time violations in an IC by using solely active delay elements such as buffers or inverters, as mentioned above, can be mitigated by complementing or replacing the active delay elements with passive delay elements which do not involve transistors. Specifically, free segments of metal segments (or suitable electrically-conductive segments) may be utilized as passive delay elements that can be added to the short data path. The free segments are "free" as they are utilized at no extra cost in terms of added silicon area. For example, the free segments may either be accommodated from track-based dummy fill, or directly extracted from empty routing space. The free segments of metal segments used to fix a hold-time violation of a net are preferably located in a neighboring area that is physically close to the net. The free segments, interchangeably referred as "compensation stubs" herein, are appended to or otherwise extend from the net to contribute or add to a total capacitance at the net such that the total capacitance at the net has a value that fulfills a hold-time requirement at the net, thereby fixing the hold-time violation. For example, one or more compensation stubs consisting of free segments may be added to net 234 of IC 210 of FIG. 2 such that net 234 has a total capacitance that is sufficient to delay a data on net 234. Consequently, when arriving at the terminal D of D flip-flop 12 of IC 210, the data has, instead of waveform 333 of FIG. 1, a waveform of waveform 331, 332 or 334 with respect to a clock signal of waveform 550 arriving at terminal CLK of D flip-flop 12, thereby fulfilling a hold-time requirement at net 234.

In some embodiments, the hold-time requirement may be fulfilled by adding compensation stubs to more than one of nets 231, 232, 233 and 234 of IC 210. That is, the additional propagation delay needed to slow down data propagating on short data path 23 of IC 210 may be distributed over a number of nets of data path 23. For example, in order to fix the hold-time violation at the terminal D of D flip-flop 12, it would require the addition of 200 femto farads (fF) of capacitance to electrical node 234. However, the free metal segments around electrical node 234 that are available to be appended to electrical node 234 as compensation stubs may contribute less than the 200 fF that is needed, and thus by themselves the available free metal segments around net 234 are not enough to fix the hold-time violation. Accordingly, the hold-time violation may be fixed by additionally appending one or more free metal segments as compensation stubs to one or more of nets 231, 232 and 233, such that all the compensation stubs added along the various nets/electrical nodes of data path 23 may contribute, in combination, to an additional propagation delay that is large enough to fix the hold-time violation at the terminal D of D flip-flop 12.

Compared with the buffer insertion approach, the free metal segment approach of fixing a hold-time violation in accordance with the present disclosure have a number of advantages. Firstly, the metal segments do not consume leakage power. Secondly, the resulted delay is relatively stable over different PVT corners. Thirdly, free segments do not induce issues that may affect metal routability. Moreover, the added delays of short segments are more predictable. Additionally, free segments do not add to utilization overhead.

Figure 3:
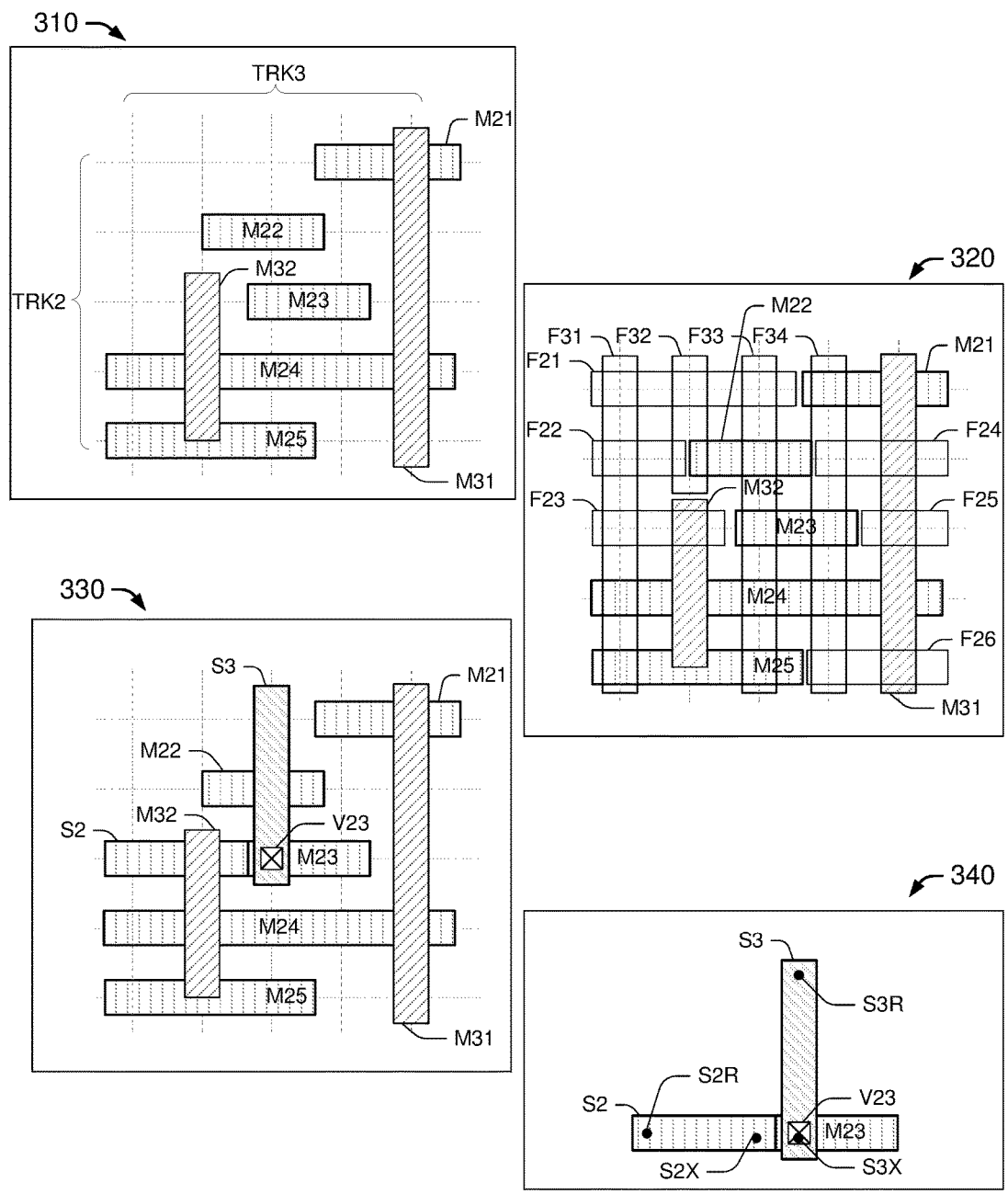
FIG. 3 is a diagram depicting an example hold-time violating net and available locations of free metal segments around the hold-time violating net in accordance with an implementation of the present disclosure.

FIG. 3 illustrates an example layout of a hold-time violating net, namely, an electrical node of an IC (such as net 13 of IC 110 of FIG. 1, or any of nets 231, 232, 233 and 234 of IC 210 of FIG. 2) that couples a first sequential-logic device of the IC (such as D flip-flop 11 of FIG. 1 or FIG. 2) to a second sequential-logic device of the IC (such as D flip-flop 12 of FIG. 1 or FIG. 2), and is subject to a hold-time violation at an input terminal of the second sequential-logic device (such as the D terminal of D flip-flop 12 of FIG. 1 or FIG. 2). In addition, FIG. 3 also illustrates how the hold-time violation may be fixed by appending compensation stubs of free metal segments to the electrical node or net. Specifically, layout 310 of FIG. 3 reveals metal utilization of the IC of M2 and M3 layers prior to appending free metal segments to fix the hold-time violation. As shown in layout 310, the hold-time violating net is routed using M2 layer of the IC, comprising metal segment M23. Also shown in layout 310 are metal segments M21, M22, M24 and M25 of M2 layer and metal segments M31 and M32 of M3 layer. Segments M21, M22, M24, M25, M31 and M32 are utilized by one or more other nets of the IC that are electrically decoupled from the hold-time violating net that comprises segment M23. As shown in FIG. 3, metal segments of M2 layers are laid out in a preferred direction of M2 layer along the plurality of imaginary M2 tracks TRK2. Similarly, metal segments of M3 layers are laid out in a preferred direction of M3 layer along the plurality of imaginary M2 tracks TRK3.

As mentioned above, an IC fabrication process or technology may employ a plurality of metal layers. Two metal layers are said to be adjacent to one another if one layer of the two metal layers is one layer above or below the other. For example, M2 layer may have two adjacent metal layers, M1 and M3, and M3 layer may have two adjacent metal layers, M2 and M4. Typically, for a semiconductor fabrication process used to fabricate the IC, each metal layer (sometimes with an exception for the lowest layer) of the IC has a preferred routing direction along which the metal segments or metal routing of the IC in the respective metal layer would be laid out and realized. Furthermore, adjacent layers of metal usually have their respective preferred routing directions substantially orthogonal to one another. For example, as shown in FIG. 3, the preferred routing direction of M2 layer, represented by M2 tracks TRK2, is substantially perpendicular to the preferred routing direction of M3 layer, represented by M3 tracks TRK3. Therefore, if there are 7 layers of metal used in the IC, typically M2, M4 and M6 layers will have a preferred routing direction that is orthogonal to that of M3, M5 and M7 layers. M1 layer, being the lowest layer of the IC (i.e., the metal layer that is the closest to the active devices, such as transistors, of the IC), may not have a specific preferred metal routing direction, and metal routing in M1 layer may thus be routed in both directions.

In order to fix the hold-time violation at the electrical node (i.e., the hold-time violating net), one or more compensation stubs, each comprising one more free metal segments, may be appended or otherwise connected to the hold-time violating net at segment M23 of layout 310 of FIG. 3. Each compensation stub would contribute a compensation capacitance as part of a total capacitance at the hold-time violating net. The total capacitance would have a value that fulfills the hold-time requirement at the electrical node, thereby fixing the hold-time violation. Without the compensation capacitance provided by the one or more compensation stubs, the value of the total capacitance at the electrical node would have been too low to slow down a short data path, and the hold-time requirement at the electrical node would not have been fulfilled.

In diagram 320, locations of free metal segments available on M2 and M3 layers around metal segment M23 are identified, among which 6 are identified on M2 layer (i.e., free segments F21, F22, F23, F24, F25 and F26) and 4 are identified on M3 layer (i.e., free segments F31, F32, F33 and F34). Depending on the amount of compensation capacitance needed to enable the total capacitance at the hold-time violating net to comply with the hold-time requirement, one or more of the 10 available free segments may be connected to the hold-time violating net at metal segment M23 as compensation stubs.

Layout 330 of FIG. 3 shows two compensation stubs, S2 and S3, that have been selected among the available free segments identified in diagram 320 and connected to metal segment M23. Specifically, compensation stub S2 comprises free segment F23 in its entirety, while compensation stub S3 comprises only a portion of free segment F33, as the entirety of free segment F33 might have contributed more compensation capacitance than is needed to fix the hold-time violation. Since free segment F23 and metal segment M23 are both located on M2 layer, segment F23 and metal segment M23 are connected by extending toward and touching one another in the preferred routing direction of M2 layer. Namely, after the hold-time compensation using free metal segments, metal segment M23 and compensation stub S2 are essentially a single continuous M2 piece of polygon in layout 330. That is, when fabricated, metal segment M23 and compensation stub S2 are realized in a single continuous piece of M2 layer, and the connection between the two are made in-situ. On the other hand, free segment F33 is located on M3 layer, and thus an electrical connection formed by via V23 is required to connect compensation stub S3 to metal segment M23, as shown in layout 330.

Each of compensation stubs S2 and S3 may be identified to have a fixed end and a free end. The fixed end refers to the end of the compensation stub that connects to the hold-time violating net, while the free end refers to the end of the compensation stub that opposes the fixed end and does not electrically couple to another electrical node of the IC (except for the hold-time violating net that the fixed end connects to). As shown in diagram 340 of FIG. 3, the fixed end and the free end of compensation stub S2 are labeled as S2X and S2R, respectively, while the fixed end and the free end of compensation stub S3 are labeled as S3X and S3R, respectively. Compensation stub S2 can be viewed as being electrically coupled to a first joint location of metal segment S23 (i.e., the end of metal segment S23 that meets compensation stub S2) that is located on the same metal layer of the IC (i.e., M2 layer) as fixed end S2X. In fact, fixed end S2X of compensation stub S2 is connected to the first joint location in-situ on M2 layer. Similarly, compensation stub S3 can also be viewed as being electrically coupled to a second joint location of metal segment S23 (i.e., the location of metal segment S23 where via V23 connects to metal segment S23). However, the second joint location of metal segment S23 is located on M2 layer, while fixed end S3X of compensation stub S3 is located on M3 layer which is one metal layer above M2 layer. Therefore, via V23 is employed to connect fixed end S3X to the second joint location.

Although diagram 320 of FIG. 3 does not show available free metal segments on metal layers other than M2 and M3, there may be a free metal segment on those other metal layers that is suitable for being used as a compensation stub and connected to metal segment M23 for fixing the hold-time violation. For example, there may be a free metal segment on M1 layer that is suitable, and a via between M1 and M2 layers is needed to establish the electrical connection between metal segment M23 and the compensation stub on M1 layer. As another example, there may be a free metal segment on M5 layer that is suitable, and a stacked via between M5 and M2 layers is needed to traverse across M3 and M4 layers and electrically couple a fixed end of the compensation stub on M5 layer to a joint location of metal segment M23 on M2 layer.

Depending on the semiconductor fabrication process used, each of the metal layers of the IC may have a respective minimum line width, or $W_{min}$, which defines the minimum width of a metal routing allowed in the respective metal layer. A free metal segment for realizing a compensation stub may or may not have a physical width that is equal to $W_{min}$ of the respective metal layer. For example, free segments F21, F22, F23, F24, F25 and F26 of diagram 320, as well as compensation stubs S2 of layout 330, may typically have a width equal to the allowable minimum line width of M2 layer. Similarly, free segments F31, F32, F33 and F34 of diagram 320, as well as compensation stubs S3 of layout 330, may typically have a width equal to the allowable minimum line width of M3 layer. In some embodiments, however, it is also possible to employ a free segment having a physical width larger than $W_{min}$ of the respective metal layer as a compensation stub, especially if a wider free segment is available in the layout and a higher compensation capacitance is needed for fixing a hold-time violation.

Figure 4:
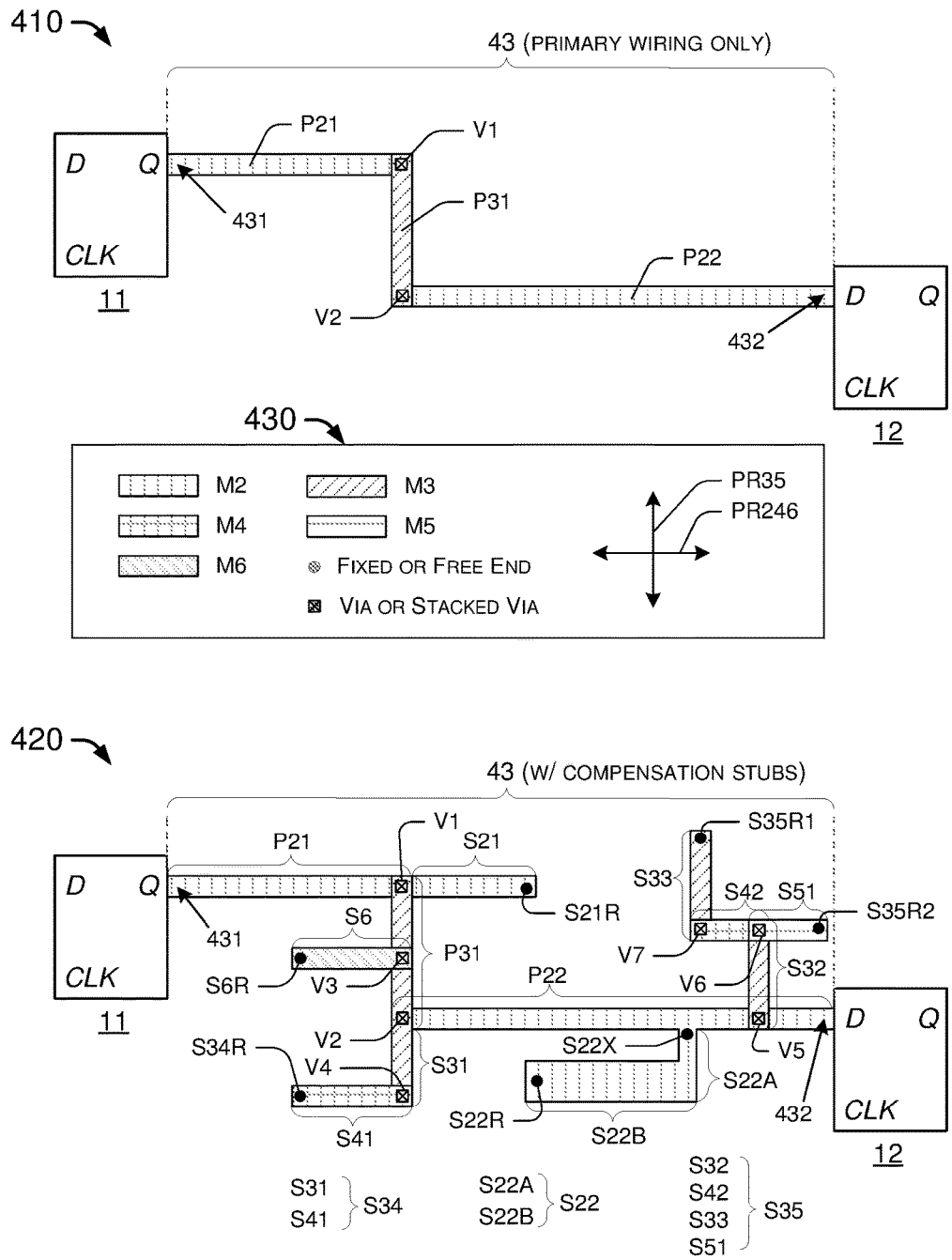
FIG. 4 is a diagram depicting an example layout of a plurality of compensation stubs as applied to an electrical node in accordance with an implementation of the present disclosure.

FIG. 4 illustrates an example layout of a net 43 coupling two D flip-flops 11 and 12 of an IC, as well as how a hold-time violation at the D terminal of D flip-flop 12 may be fixed by adding free metal segments as compensation stubs. Specifically, layout 410 illustrates net 43 prior to fixing the hold-time violation, while layout 420 illustrates net 43 after fixing the hold-time violation. In some embodiments, the IC may have 6 layers of metals, M1-M6. As shown in FIG. 4, net 43 has a plurality of electrically-conductive elements, including metal segments P21 and P22 of M2 layer of the IC, metal segment P31 of M3 layer of the IC, and vias V1 and V2 that connect metal segments P21 and P22 to metal segment P31, respectively. In addition, as shown in layout 420 of FIG. 4, the plurality of electrically-conductive elements further include metal segment S21 (of M2 layer), metal segment S6 (of M6 layer), an L-shaped metal piece S22 (of M2 layer) comprising metal segments S22A and S22B, an L-shaped metal piece S34 comprising metal segment S31 (of M3 layer) and S41 (of M4 layer), metal segments S32 and S33 (of M3 layer), metal segment S42 (of M4 layer), metal segment S51 (of M5 layer), stacked via V3 that connects metal segment S6 to metal segment P31, via V4 that connects metal segment S41 to metal segment S31, via V5 that connects metal segment S32 to metal segment P22, stacked via V6 that connects metal segments S32, S42 and S51, and via V7 that connects metal segment S42 to metal segments S32.

The plurality of electrically-conductive elements of FIG. 4 may be categorized into two groups or two subsets. The first subset comprises metal segments P21, P31 and P22 as well as vias V1 and V2, collectively forming a primary wiring, as shown in layout 410, that electrically couples D flip-flop 11 to D flip-flop 12. The routing of the primary wiring (i.e., the location and the metal layer of each metal segment of the primary routing) may be determined by an APR design tool or software, and thus the primary wiring comprises a single wiring connecting the Q terminal of D flip-flop 11 to the D terminal of D flip-flop 12 without any free or loose end. That is, the primary wiring of net 43, as shown in layout 410, has a first end 431 connected to the Q terminal of D flip-flop 11, and a second end 432 connected to the D terminal of D flip-flop 12. It is this primary wiring consisting of the first subset of the plurality of the electrically-conductive elements that carries data or otherwise a digital signal from the Q terminal of D flip-flop 11 to the D terminal of D flip-flop 12. Since the primary wiring is a result of APR, the metal segments of the first subset are routed following their respective preferred routing directions as defined for individual metal layers. For example, M2, M4 and M6 layers of the IC maybe routed along a preferred direction PR246, as shown in figure legend 430 of FIG. 4, while M3 and M5 layers of the IC maybe routed along a preferred direction PR35 that is substantially orthogonal to preferred direction PR246, also as shown in FIG. 4. Nevertheless, with only the primary wiring connecting D flip-flops 11 and 12, the hold-time violation exists. Namely, a hold-time requirement at the D terminal of D flip-flop 12 is not fulfilled with only the primary wiring connecting D flip-flops 11 and 12. One or more compensation stubs would need to be added to the primary wiring to fix the hold-time violation.

As shown in layout 420 of FIG. 4, five compensation stubs are appended to the primary wiring, with the five compensation stubs realized by a second subset of the plurality of electrically-conductive elements of net 43. The second subset comprises metal segments S21, S6, S22A, S22B, S31, S41, S32, S42, S51 and S33, as well as stacked vias V3 and V6 and vias V4, V5 and V7. Among the five compensation stubs, a first compensation stub includes metal segment S21; a second compensation stub includes metal segment S6; a third compensation stub includes metal segments S31 and S41, and via V4 connecting the two metal segments; a fourth compensation stub includes L-shaped metal piece S22 that has metal segments S22A and S22B; finally, a fifth compensation stub includes a tree-like metal piece S35 that includes metal segments S32, S33, S51 and S42, vias V5 and V7, and stacked via V6. Each of the five compensation stubs has a fixed end, through which the respective compensation stub is electrically coupled to the primary wiring by having the fixed end connected to a joint location of the primary wiring, and a free end (note: one of the compensation stubs actually has two free ends), which is not electrically coupled to any net of the IC other than net 43. Namely, each of the five compensation stubs may be viewed as extending from the primary wiring from a respective joint location of the primary wiring and terminated in a metal layer of the IC as a loose end (i.e., the free end) without connecting to an active device of the IC.

For example, compensation stub S21 extends from via V1 (i.e., the joint location of the primary wiring for compensation stub S21) and is terminated at a free end S21R. The fixed end of compensation stub S21 is the end of compensation stub S21 opposing free end S21R. The joint location for compensation stub S21 and the fixed end of compensation stub S21 are located on the same metal layer (i.e., M2 layer) of the IC. Therefore, the fixed end of compensation stub S21 is connected to the joint location in-situ on M2 layer.

Similar to compensation stub S21, the joint location of the primary wiring for compensation stub S22 is also located on the same layer (i.e., M2 layer) of the IC as the fixed end of compensation stub S22. As shown in layout 420 of FIG. 4, the L-shaped compensation stub S22 has a fixed end S22X and a free end S22R. The joint location for compensation stub S22 is where metal segment P22 interfaces with fixed end S22X of compensation stub S22 and is connected to fixed end S22X in-situ on M2 layer. One unique feature of compensation stub S22 is that it comprises metal segment S22A which is routed in a non-preferred routing direction of M2 layer (i.e., in direction PR35 of FIG. 4). Unlike other M2 layer metal segments P21, S21, P22 and S22B that are routed in preferred routing direction PR246 of M2 layer, metal segment S22A is routed in the direction of PR35, a non-preferred routing direction of M2 layer. In general, a metal segment routed in a non-preferred routing direction would not be allowed by an APR design tool, and thus would not be used for a primary wiring of an electrical node. Another unique feature of compensation stub S22 is that metal segment S22B may be wider than the minimum line width, or $W_{min}$, of M2 layer. All other metal segments in layout 420 may be at the minimum line widths of respective metal layers.

Compensation stub S35 of layout 420 is in a tree-like shape having four metal segments: S32, S42, S51 and S33. The four metal segments are interconnected using stacked via V6 and via V7 to form compensation stub S35. At one end (i.e., a fixed end) of compensation stub S35, compensation stub S35 is connected to a joint location of the primary wiring through via V5. The fixed end of compensation stub S35, located on M3 layer, is where metal segment S32 interfaces via V5. The joint location of the primary wiring for compensation stub S35, located on M2 layer, is where via V5 interfaces metal segment P22. One unique feature of compensation stub S35 is that compensation stub S35 has two free ends, S35R1 and S35R2. The tree-shaped compensation stub S35 is terminated at a free end S35R1 located on M3 layer, and also at a free end S35R2 located on M5 layer. The joint location of the primary wiring for compensation stub S35 and the fixed end of compensation stub S35 are located on adjacent metal layers (i.e., M2 and M3 layers), and are electrically coupled to one another through via V5 disposed between the two adjacent metal layers. Note that metal segment S51, being a M5 metal segment, is routed in a non-preferred direction of M5 layer.

Compensation stub S6 of layout 420 also has a free end S6R and a fixed end (i.e., the end of metal segment S6 that interfaces stacked via V3). That is, compensation stub S6 extends from a joint location of the primary wiring (i.e., where stacked via V3 interfaces metal segment P31) and is terminated in M6 layer at free end S6R. Compensation stub S6 is electrically coupled to the primary wiring through the fixed end that connects to the primary wiring through stacked via V3 at the joint location.

Similar to compensation stubs S21 and S22, the joint location of the primary wiring for compensation stub S34 is also located on the same layer (i.e., M3 layer) of the IC as a fixed end of compensation stub S34 (i.e., the end of metal segment S31 where it interfaces metal segment P31. As shown in layout 420 of FIG. 4, the L-shaped compensation stub S34 comprises two metal segments, S31 on M3 layer and D41 on M4 layer. Compensation stub S34 also has a free end S34R. The joint location for compensation stub S34 is where metal segment P31 interfaces with compensation stub S34 and is connected to the fixed end of compensation stub S34 in-situ on M3 layer.

The compensation stubs shown in layout 420 of FIG. 4 are exemplary only and not meant to exhaust possible scenarios of compensation stubs that can be realized based on the present disclosure. For example, a compensation stub may include free metal segment(s) in same or different layer(s) as the metal segment(s) of primary wiring. Also, a compensation stub may include a single metal segment, or any other number of free segments which are electrically coupled with each other through any number of vias or stacked vias and formed into an L shape, a tree-like shape, a zig-zag shape or any other piecewise-linear topology. However, each of all possible compensation stubs for an electrical node has a fixed end through which the respective compensation stub is electrically coupled to a primary wiring of the electrical node. In addition, each compensation stub has at least one free end that is terminated in one or more metal layers of the IC without connecting to an active device of the IC, and thus is not electrically coupled to any electrical node of the IC other than the electrical node.

In some embodiments, the IC of FIG. 4 may further include one or more combinational-logic gates inserted between first end 431 of the primary wiring and D flip-flop 11. In some embodiments, the IC of FIG. 4 may further include one or more combinational-logic gates inserted between second end 432 of the primary wiring and D flip-flop 12. Namely, in order to fulfill a hold-time requirement at the D terminal of sequential-logic device 12 of IC 210 in FIG. 2, one or more of nets 231, 232, 233 and 234 of IC 210 may include a primary wiring like the one shown in layout 410 of FIG. 4, as well as one or more compensation stubs as those shown in layout 420 of FIG. 4.

As mentioned earlier, passive delay elements, i.e., compensation stubs consisting of free metal segments, may be most suitable for correcting or fixing hold-time violation of low values, such as a negative hold-time margin of about 10 ps or below. Larger hold-time violations (i.e., with a more negative hold-time margin) may be more efficiently fixed using active delay elements such as inverters. Therefore, in some embodiments, net 43 of FIG. 4 may further include an inverter, or a chain of inverters (i.e., a plurality of inverters connected in series), that is electrically connected in series with the primary wiring thereof between D flip-flops 11 and 12.

In some embodiments, a compensation stub may include one or more vias or stacked vias, without any free metal segment. For example, a compensation stub may include only stacked via V3 (a stacked via that goes from M3 layer to M6 layer) of layout 420 of FIG. 4, without metal segment S6 thereof. That is, stacked via V3 by itself may already contribute enough capacitance to the total capacitance at the D terminal of D flip-flop 12 such that the hold-time requirement at the D terminal of D flip-flop 12 is fulfilled.

As demonstrated above, metal segments are used as passive delay elements in the free segment approach for fixing a hold-time violation. Nevertheless, it is also feasible to employ free segments of other electrically-conductive layers of the IC as passive delay elements. For example, free segments of polysilicon may also be utilized, alone or in combination with free metal segments, to fix a hold-time violation of a net.

Overview of Hold-Time Compensation Using Free Segments

Figure 5:
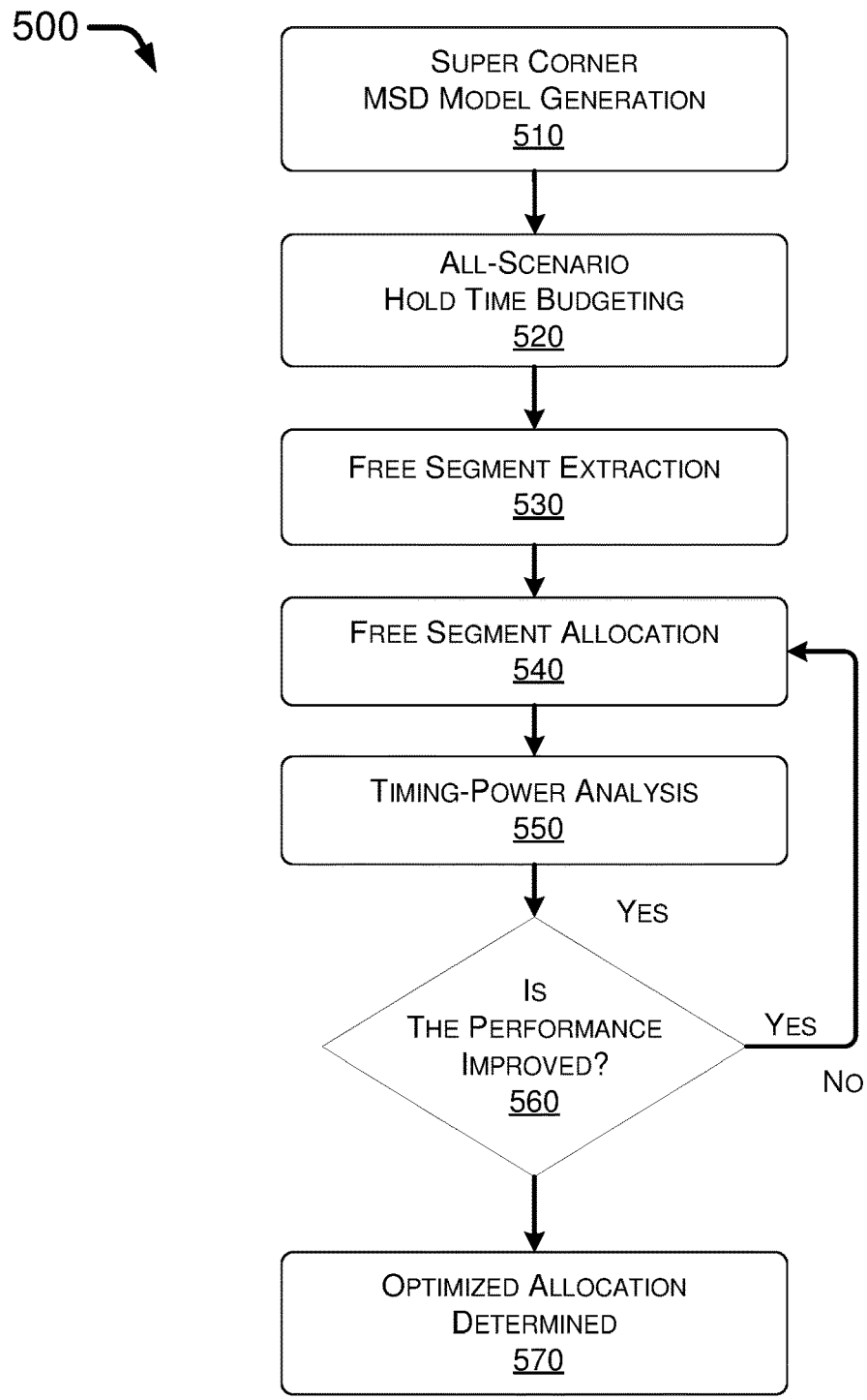
FIG. 5 is a diagram depicting an example process of hold-time compensation using free segments in accordance with an implementation of the present disclosure.

A framework is proposed, as illustrated in example process 500 of FIG. 5, to validate hold-time compensation by free metal segment allocation as the final step of timing closure for a design of an IC. Process 500 may include one or more operations, actions, or functions as represented by one or more of blocks 510, 520, 530, 540, 550, 560 and 570. Although illustrated as discrete blocks, various blocks of process 500 may be divided into additional blocks, combined into fewer blocks, or eliminated, depending on the desired implementation. Process 500 may begin at 510.

At 510, based on layer-specific physical parasitics, a metal and via delay model (referred as "metal segment delay (MSD) model") may be calibrated or otherwise constructed to record the delay (in time) of a unit-length metal segment of each metal layer, and of each kind of via and stacked via, as driven by various logic devices used in the IC, of each possible driving strength. The MSD model, built with an artificial neural network (ANN) approach, is a "super corner" model, such that the delay information of the model is able to cover or otherwise represent the all PVT process corners in a statistically meaningful way. Process 500 may proceed from 510 to 520.

At 520, hold-time budgeting is performed using the super model for different operation modes of the IC (such as normal operation mode, testing mode, scan mode and calibration mode), and then merged into a single set of hold-time budgeting that covers or otherwise represents all scenarios (i.e., all PVT process corners and circuit operation modes). Process 500 may proceed from 520 to 530.

At 530, unoccupied metal segments (i.e., free metal segments) are extracted from the entire layout of the IC. Process 500 may proceed from 530 to 540.

At 540, free metal segments are assigned or otherwise allocated as compensation stubs, which are then appended to nets of short data paths of the IC to fix hold-time violations thereof. A flow network may be constructed to capture the relationship between each of the hold-time violating nets and the respective neighboring free metal segments. The flow network, generally large in size, may be reduced and partitioned into subnetworks based on articulation points of the flow network. Minimum cost network flow may then be performed to obtain a free segment assignment or allocation. Process 500 may proceed from 540 to 550.

At 550, a timing-power analysis of the IC is executed and reported to evaluate the effectiveness of the free segment allocation. Process 500 may proceed from 550 to 560.

At 560, result of the timing-power analysis from 550 (i.e., the performance of the current allocation) is compared to the timing and power performance from the previous round of hold-time compensation (i.e., the performance of the previous allocation). In an event that the performance of the current allocation is improved (i.e., lower power, fewer timing violation, or both) over the performance of the previous allocation, process 500 may proceed from 560 to 540 for another round of iteration of free segment allocation. In an event that the performance of the current allocation is not improved over the performance of the previous allocation, process 500 may proceed from 560 to 570.

At 570, the free segment allocation of the previous round of iteration may be deemed the optimized allocation, and process 500 may terminate at 570.

Figure 6:
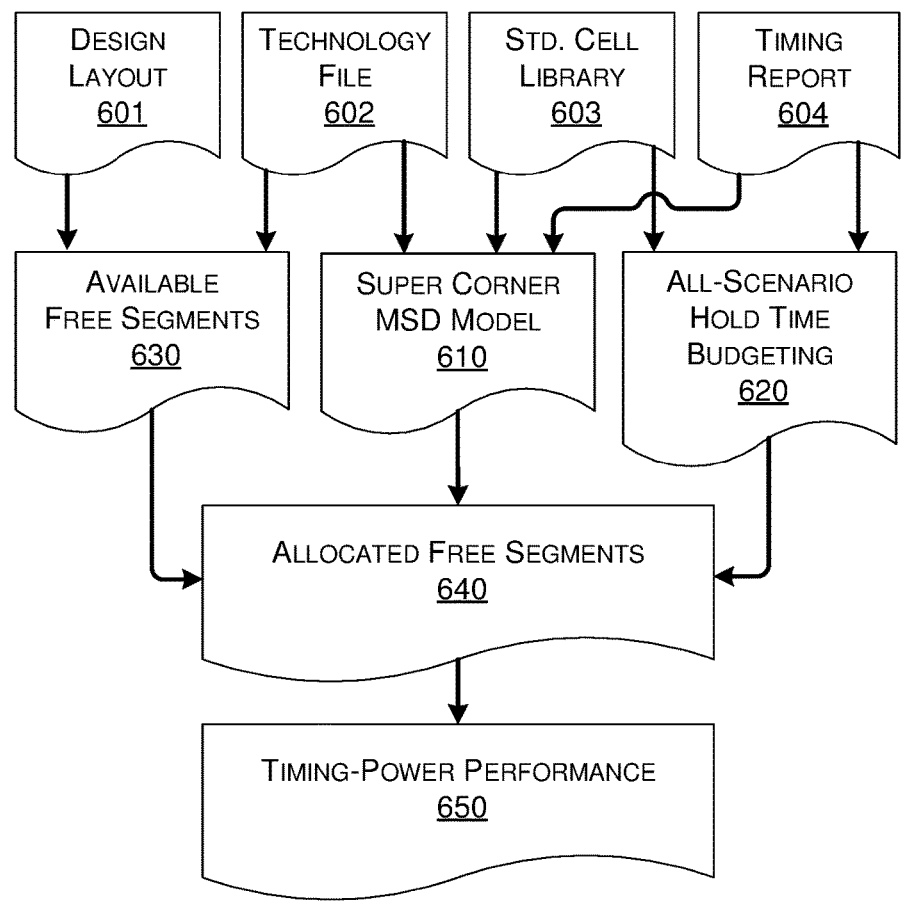
FIG. 6 is a diagram depicting a data flow of the example process of FIG. 5 in accordance with an implementation of the present disclosure.

FIG. 6 illustrates a data flow 600 related to process 500 of FIG. 5. As shown in FIG. 6, four pieces of information are utilized by process 500 as input: design layout 601, technology file 602, standard cell library 603 and timing report 604. Namely, given a placed and routed design (i.e., design layout 601), a technology file 602 of the semiconductor manufacturing process used to fabricate the IC, a standard cell library 603 comprising standard logic cells and other building blocks used in the IC, and hold violating paths of current design (as part of timing report 604), process 500 would assign free metal segments to hold-time violating nets such that one or more of number of hold-time violations, silicon area and leakage power of the IC design are minimized.

Specifically, block 510 of process 500 may take technology file 602, standard cell library 603 and timing report 604 as input to generate the super corner MSD model 610. In addition, block 510 of process 500 may take standard cell library 603 and timing report 604 as input to generate the all-scenario hold-time budgeting 620. The all-scenario hold-time budgeting dictates, for each short data path shown in timing report 604, how much hold-time margin needs to be added to or subtracted from existing hold-time margin, such that timing requirements, including setup time, hold-time and transition requirements, may be fulfilled under all PVT process corners and circuit operation modes. Furthermore, block 530 of process 500 may take design layout 601 and technology file 602 as input to extract available free segments 630 (i.e., locations of free segments that may be available for constructing compensation stubs, such as those shown in layout 420 of FIG. 4) in neighboring areas of each short data path. With super corner MSD model 610 constructed, all-scenario hold-time budgeting 620 allocated and available free segments 630 identified, block 540 of process 500 may take all three of them as input and select or allocate some free segments 640 from available free segments 630 as compensation stubs. The selection is by looking up super corner MSD model 610 to find suitable free segments that may contribute enough capacitances to enable the short data paths to fulfill the timing requirements. Finally, block 550 of process 500 may perform a full-chip timing and power analysis, with selected free segments 640 added to the short data paths. The result of the timing and power analysis may be saved as timing-power performance 650 of the present iteration, which is subsequently used by blocks 560 and 570 of process 500 to determine whether allocated free segments 640 of the present iteration may or may not be an optimized free segment allocation for fixing the hold-time violations of the short data paths of the IC.

Details of some of the blocks 510, 520, 530, 540, 550, 560, 570 and 580 of process 500 are discussed below in later parts of the present disclosure, along with data flow 600 of FIG. 6.

MSD Model Generation

Figure 7:
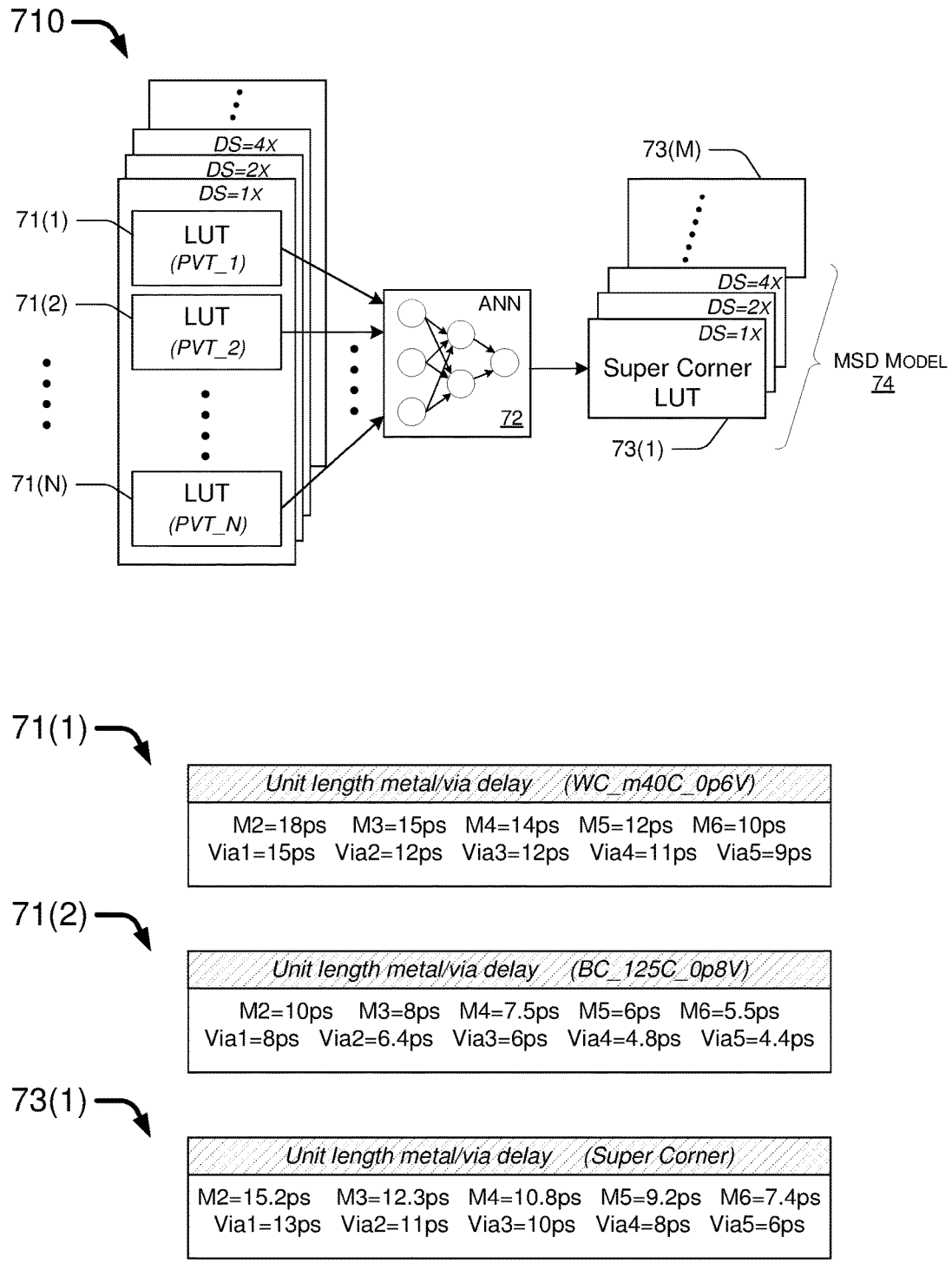
FIG. 7 is a flowchart of an example process of generating a super corner metal segment delay model in accordance with an implementation of the present disclosure.

Based on technology file 602, standard cell library 603 and timing report 604 of FIG. 6, a super corner MSD model 610 may be constructed using an approach involving one or more ANNs, as depicted in FIG. 7. One or more ANNs are employed mainly for the ability to estimate or approximate functions that depend on a large number of inputs. Through processing certain amount of data (referred as "training data") by the ANNs, the resulted MSD model may be "trained" or fine-tuned such that the MSD model becomes a so-called "super model" that is able to cover all PVT corners. Namely, hold-time compensation with this "super corner" would automatically ensure that the hold-time compensation would be valid for all other PVT corners. Hence, the timing closure software or tool only needs to check for timing constrains of a design for this super corner, instead of checking for all PVT corners one by one.

Under a proposed scheme of the present disclosure, to train the MSD model through the ANNs, training data are needed with various look-up table (LUT) parameters including device driving strengths, physical RC (i.e., resistance and capacitance) parasitics of each metal layers, PVT corners, net topologies, and the like. The driving strength (DS) is normalized regardless of specific device types available in the cell standard library. The DS of a device is typically represented by a DS rating as 1×, 2×, 4×, 6×, 8×, etc. Regardless of specific device types, all devices in standard cell library 603 of FIG. 6 that have a same DS rating have a same amount of delay when driving a same loading (e.g., a piece of metal of M2 layer of unit length). A design corner corresponds to a distinct process/voltage/temperature (PVT) condition (including interconnect setting, such as min/max RC). Based on the timing report on a corner, the unit-length metal and via delay values of each net are computed. Besides, various net topologies are considered (e.g., T1, T2, . . . , TM). After the training, all devices of a same DS rating and having a same net topology will a same super corner delay model (i.e., MSD model 610 of FIG. 6). The super corner approach enables merging all PVT corners into one super corner and thus reducing the checking time over all scenarios. Furthermore, when track-based dummy fill is adopted, the coupling effect is considered. In the later part of process 500, the super corner MSD models will serve as LUTs, indexed by metal layer number of a free segment, DS rating of the driving cell, as well as topology of a violating net.

Diagram 710 of FIG. 7 illustrates the MSD model generation process mentioned above. For each DS rating, a plurality of LUTs, such as LUTs 71(1), 71(2), . . . and 71(N), are fed into ANN 72 as training data, one LUT for each PVT corner. As shown in FIG. 7, LUT 71(1) may record delay information of various unit-length metal segments or vias when driven by driving devices of 1× DS rating under the PVT condition of −40 degrees Celsius (° C.) temperature, 0.6-volt (V) supply voltage, and a slowest RC (i.e., interconnect) setting. According to LUT 71(1), when a 1×DS rating device drives a M2 segment of unit length under this particular PVT condition, a 18 ps delay is introduced. Note that for each metal layer, a specific unit length may be defined. Similarly, LUT 71(2) may record delay information of unit-length metal segments or vias when driven by driving devices of 1×DS rating under the PVT condition of 125° C. temperature, 0.8 V supply voltage, and a fastest RC (i.e., interconnect) setting. According to LUT 71(2), when a 1×DS rating device drives a M5 segment of unit length under this particular condition, a 6 ps delay is introduced. The total number of LUTs fed into ANN 72 is determined by the total number of various combinations of the LUT parameters. Each delay value in a LUT is characterized, calibrated or otherwise simulated using a software tool.

As shown in diagram 710, there are totally N different PVT corners for each DS rating. Therefore, delay information for devices having 1×DS rating is represented by LUTs 71(1)-71(N), one LUT for each PVT corner. ANN 72 may process LUTs 71(1)-71(N) and generate a super corner LUT 73(1) for all 1×DS rating devices. Assuming standard cell library 603 includes devices having M different DS ratings, then ANN 72 may process a total number of (M times N) LUTs and generate M different super corner LUTs 73(1)-73(M), one super corner LUT for one DS ratings, as shown in diagram 710 of FIG. 7. Super corner LUTs 73(1)-73(M) are collectively referred as MSD Model 74, which is referred to as super corner MSD model 610 in data flow 600, as shown in FIG. 6.

All-Scenario Hold-Time Budgeting

Shrinking manufacturing technology and growing design complexity have resulted in an explosion in the number of scenarios to be validated for timing closure. The number of scenarios equals to the number of circuit operation modes times the number of PVT corners. Different from the conventional approach for hold-time compensation, which focuses on each scenario, the present disclosure adopts corner reduction and mode merging before hold-time budgeting to reduce the subsequent checking time (i.e., the time spent on checking each of the scenarios). Corner dominance is utilized to reduce corners, while clique partitioning is utilized to merge modes. Namely, present disclosure advocates hold-time budgeting that is applicable to all scenarios, hence the "all-scenario hold-time budgeting".

Under a proposed scheme of the present disclosure, with corners having been reduced and modes merged, hold-time budgeting is performed to determine which nets are supposed to add delay to, and how much for each of such nets, in order to fulfill hold-time requirements across the design. The present disclosure employs a backward-forward scheme (i.e., backward slack merging plus forward timing budgeting) as shown in FIG. 8.

Figure 8:
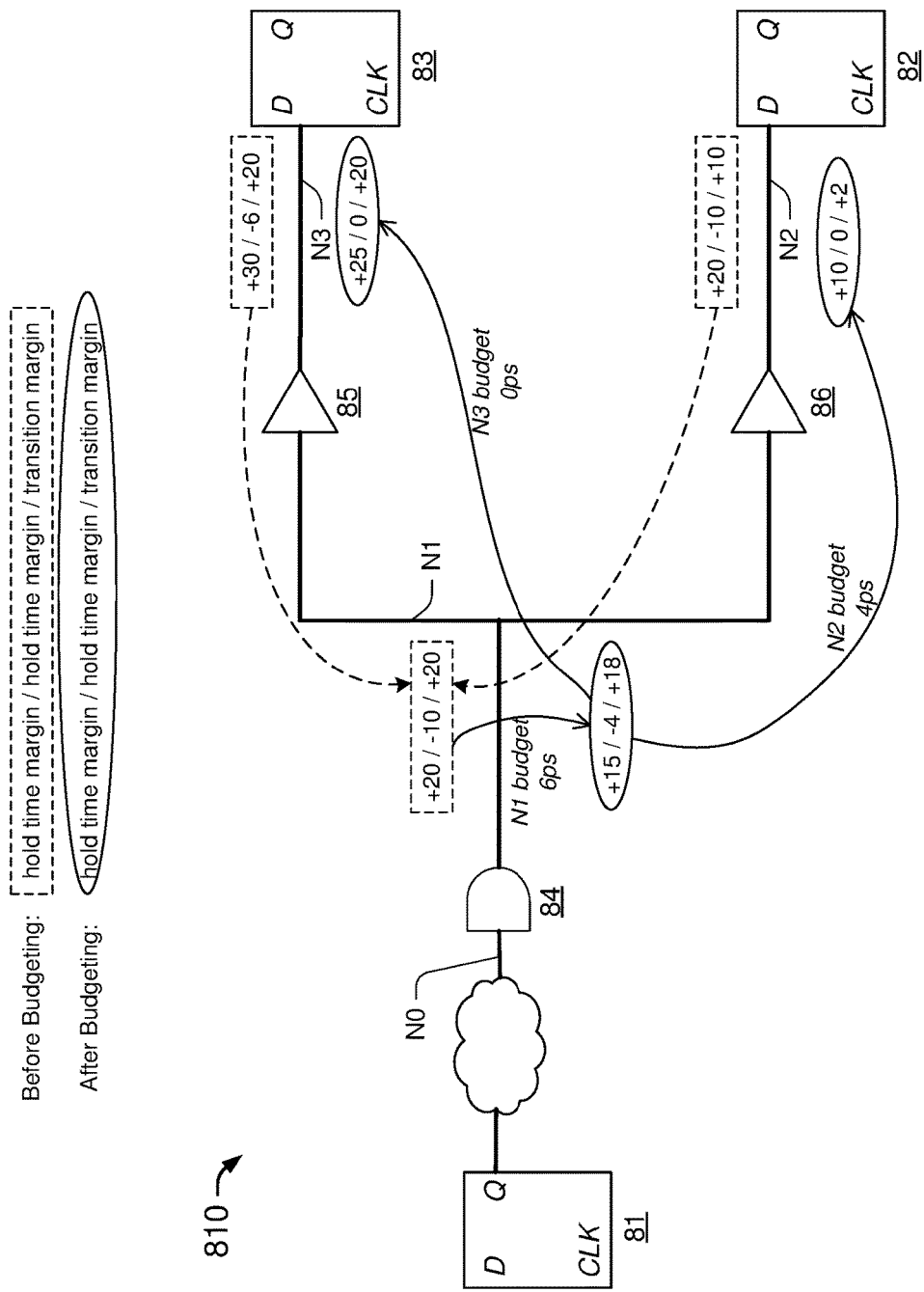
FIG. 8 is a diagram depicting an example process of all-scenario hold-time budgeting in accordance with an implementation of the present disclosure.

FIG. 8 illustrates how backward-forward hold-time budgeting may be applied to an example IC 810 having at least a hold-time violating net. IC 810 has three sequential-logic devices 81, 82 and 83, as well as three combinational-logic devices 84, 85 and 86. The net between devices 85 and 83 is net N3, the net between devices 86 and 82 is net N2, and the net connecting devices 84, 85 and 86 is net N1. A timing report of IC 810 (such as timing report 604 of shown in data flow 600 of FIG. 6) may indicate timing slacks (i.e., setup time margin, hold-time margin and transition margin) at the input terminal of each sequential-logic device of IC 810. For example, before the all-scenario timing budgeting is conducted, the timing report may show that net N3 has a hold-time margin of −6 ps, and N2 has a hold-time margin of −10 ps. With the respective hold-time margin being a negative value, both nets N2 and N3 are hold-time violating nets where a hold-time requirement at the respective net is not fulfilled. In addition, the timing report of IC 810 also indicates that net N2 has a +20 ps setup slack and a +10 ps transition slack, and that net N3 has a +30 ps setup slack and a +20 ps transition slack.

The purpose of all-scenario hold timing budgeting is, by adding extra delay(s) at some net(s) of IC 810, to change or otherwise compensate any negative hold-time slack at an input terminal of a sequential-logic device to a zero or positive value. The budgeting may start by doing a worst-case merging of the timing slacks in a backward direction (i.e., toward the beginning of the data paths). For example, hold-time slacks of −6 ps at net N3 and −10 ps at net N2 are merged at net N1 to be −10 ps, and setup time slacks of +30 ps at net N3 and +20 ps at net N2 are merged at net N1 to be +20 ps, as shown in FIG. 8. Transition slacks are not merged, as they are inherent to each of the nets.

With the timing slacks backwardly merged, timing budgeting may now be conducted in a forward direction (i.e., toward the end of the data paths). For example, as shown in FIG. 8, a 6 ps delay may be budgeted at net N1, hoping to compensate for the −6 ps hold-time slack at net N3 before the budgeting. The 6 ps delay placed at net N1 may also help to correct part of the −10 ps hold-time slack at net N2, cutting the hold-time slack at net N2 from −10 ps to −4 ps. Therefore, a 4 ps delay may subsequently be budgeted at net N2, with an intention to compensate for the remaining −4 ps hold-time slack at net N2. No delay may be needed to be budgeted for net N3, as the −6 ps hold-time slack at net N2 before the budgeting should already be compensated for by the 6 ps delay budgeted at net N1.

A timing simulation may be executed again with the budgeted delays, generating an updated timing report. The updated timing report may show that the hold-time margin at each of nets N2 and N3 has been compensated to a value of 0 ps, as intended. As the extra delays added by the hold-time budgeting may simultaneously affect setup margin and/or transition margin along the affected data paths of IC 810, it is critical to check the updated timing report and ensure that hold-time margin and transition margin are in the data paths are still enough to fulfill relevant timing requirements. As shown in FIG. 8, with the budgeted delays, the setup time margin of nets N1, N2 and N3 has dropped to +15 ps, +10 ps and +25 ps, respectively. In addition, the transition margin of nets N1, N2 and N3 has dropped to +18 ps, +2 ps and +20 ps, respectively. Although setup time margin and transition margin at nets N1, N2 and N3 are both adversely affected by the budgeted delays used for fixing the hold-time violations, they are still maintained at zero or positive values, meaning the setup time requirement and transition requirement at nets N1, N2 and N3 are still fulfilled, although with less margin.

The transition requirement at a net may be fulfilled, even with a delay added due to hold-time budgeting, as long as a total capacitance at the net is still within an available output loading (AOL) of the net, as dictated by a driving device driving the net. The AOL represents a maximum value of total capacitance allowed at the net, which the driving device is able to drive and generate at the net an output digital signal having a slew rate that is substantially the same as that of the input signal of the driving device. The total capacitance at the net typically consists of current or existing wire loading (CWL) and next stage gate capacitance (NGC). Under a proposed scheme of the present disclosure, each delay added to the net for fixing the hold-time violation may be implemented using compensation stub(s) comprising one or more free segments. The compensation stub(s) would contribute a compensation capacitance to the total capacitance at the net. In order to keep the total capacitance at the net within the maximum allowed threshold AOL, it is imperative that the compensation capacitance is below a remaining output loading (ROL), as defined by:

$$ROL = AOL - CWL - NGC. \quad (1)$$

Namely, the hold-time budgeting is not allowed to budget at a net a delay that would be realized by a compensation stub that has a capacitance higher than the ROL of the net, or the transition requirement at the net may fail.

Hence, for the hold-time budgeting illustrated in FIG. 8, it is imperative that the budgeted delays, 6 ps at net N1 and 4 ps at net N2, are smaller than the ROL of the respective net N1 and net N2. For example, device 84 of IC 810 may have an AOL of 500 fF at its output (i.e., net N1). That is, were the total capacitance at net N1 is higher than 500 fF (in the super corner), device 84 would not be able to deliver an output digital signal having a slew rate that is the same as that of a digital signal at its input (i.e., net N0). In addition, device 84 may have a CWL of 220 fF which represents the wiring capacitance of net N1 before adding any extra capacitance due to hold-time budgeting. Moreover, each of devices 84 and 85 may have an input gate capacitance (i.e., the capacitance at the input terminal of each of devices 84 and 85) of 130 fF. It follows that, from equation (1) above, ROL of net N1 is 500−220−(100+100)=80 fF. Should it require a compensation stub having a capacitance higher than the 80 fF ROL to realize the budgeted 6 ps of delay at net N1, it means the 6 ps budgeted delay is too much to be added to net N1, and a different hold-time budgeting may have to be sought to fix the hold-time violations of IC 810. In general, should a setup time or transition timing requirement fail to be fulfilled after the hold-time budgeting, another round of hold-time budgeting may need to be conducted to seek a different set of budgeted delays.

Since the all-scenario hold-time budgeting described above is conducted with the super corner and with the operation modes merged, an IC is expected to meet hold-time requirements for all PVT corners and operation modes after the all-scenario hold-time budgeting is conducted. The budgeted delays may subsequently be implemented to the IC using one or more free segments available near the affected nets, as disclosed below.

Free Segments Extraction

Figure 9:
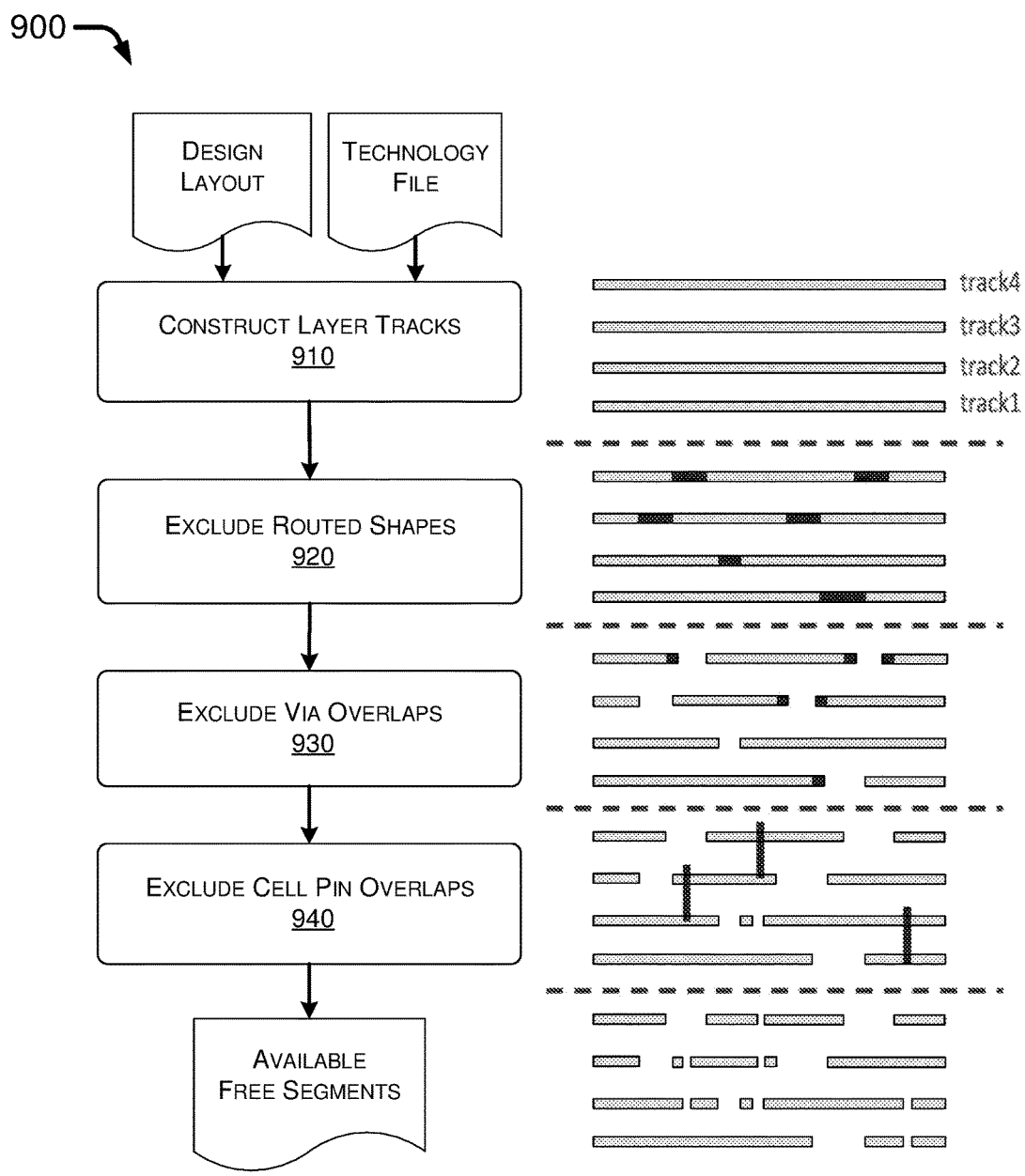
FIG. 9 is a flowchart of an example process of free segment extraction in accordance with an implementation of the present disclosure.

As shown in FIG. 9, a process 900 for free segment extraction (i.e., block 530 of FIG. 5) of an IC is presented. Process 900 takes a design layout of the IC (such as design layout 601 of FIG. 6) as input and, based on process information from a technology file (such as technology file 602 of FIG. 6) of a semiconductor fabrication process used to fabricate the IC, extract available free segments (such as available free segments 630 of FIG. 6) from the design layout, as described below. Process 900 may include one or more operations, actions, or functions as represented by one or more of blocks 910, 920, 930, and 940. Although illustrated as discrete blocks, various blocks of process 900 may be divided into additional blocks, combined into fewer blocks, or eliminated, depending on the desired implementation. Process 900 may begin at block 910.

At 910, layer tracks (i.e., tracks of layers of the IC) are constructed according to the minimum width and minimum spacing described in the technology file. Process 900 may proceed from 910 to 920.

At 920, all existing metal segments or pieces that have been routed in the design layout are excluded from the layer tracks. To satisfy the minimum spacing constraints per the technology file, an extra area of minimum wire spacing is attached surrounding each routed shape before the exclusion. Off-track routed shapes may make some remaining segments violate the minimum width constraint; these illegal segments are also excluded. Process 900 may proceed from 920 to 930.

At 930, the areas of the layer tracks that overlap with vias allocated in the design layout are also excluded. An extra surrounding area for each via is also excluded to ensure via spacing, according to the technology file. Process 900 may proceed from 930 to 940.

At 940, the areas of the layer tracks that overlap with cell pins are further excluded. The remaining are of the layer tracks are available to be used as free segments. In some embodiments, a longer segment may be further divided into shorter segments to avoid antenna effect. Minimum metal-to-metal spacing is maintained between any two free segments.

Operations described as blocks 910, 920, 930 and 940 may be performed by a Boolean engine integrated with a physical design flow engine used in the IC design flow.

Free Segments Allocation

A few characteristics of free segments and hold-time violations are observed as a foundation for allocating free segments to fix the violations: 1) Being addressed in the final step of timing closure, although hold-time violations are typically numerous and scattered around a design, each violation is small in terms of slack value (i.e., the size of negative hold-time margin). 2) The routing of a hold-time violating net may span over multiple layers, so there exist multiple options to fix the violation of the net. 3) At advanced technology nodes, each layer exhibit different physical parasitics A free segment of a lower layer metal usually contributes a larger delay than a free segment of the same size of a higher layer metal. Thus, free segments located in lower metal layers are more cost effective for hold-time compensation. 4) Free metal segments available in this later stage of design flow where hold-time violations are addressed are usually fragmented and distributed, suitable for fixing small hold-time violations (e.g., those of 9-10 ps) which can be easily partitioned and coped with albeit their large number of instances. In fact, even if an available free segment is long, it may be preferred to be divided into shorter pieces to prevent antenna effects.

Based on the observations above, a few priority rules may be applied, under a proposed scheme of the present disclosure, when allocating free segments to form compensation stubs: (1) If a free segment is available in the same metal layer as a joint location of the primary wiring of the hold-time violating net, the free segment may have a priority to be used in a compensation stub over a free segment available in a different metal layer. (2) If free segments are available in more than one layer different from the layer of the joint location, the free segment on the lower layer may have a priority to be allocated, as a lower layer metal of a same size usually contributes a larger delay that one on a higher layer. (3) Within a metal layer, a shorter free segment that is available may have a priority to be allocated, so that a longer free segment may be allocated for a larger delay value which the shorter free segment is not enough to provide. (4) A short data path having a worse hold-time slack (i.e., having a hold-time margin with a more negative value) may have a priority to be compensated for over another short data path having a less worse hold-time slack.

Figure 10:
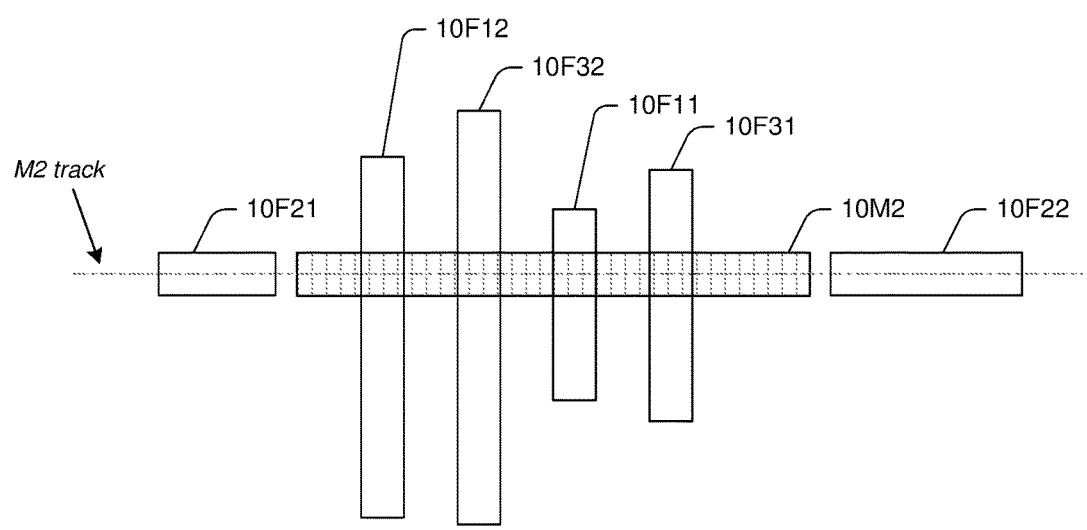
FIG. 10 is a diagram depicting example free segments available around a metal segment of a hold-time violating net in accordance with an implementation of the present disclosure.

FIG. 10 illustrates six example free segments (i.e., free segments 10F11, 10F12, 10F21, 10F22, 10F31 and 10F32) that are available around a M2 segment 10M2 which is part of the primary wiring of a hold-time violating net of an IC. In particular, free segments 10F11 and 10F12 are located on M1 layer, free segments 10F21 and 10F22 are located on M2 layer, and free segments 10F31 and 10F32 are located on M3 layer. Based on the priority rules stated above, free segments 10F21 and 10F22 have a higher priority over the rest of the free segments to be selected or otherwise allocated for a hold-time compensation stub, since 10F21 and 10F22 are located on the same metal layer (i.e., M2 layer) as segment 10M2. Moreover, between free segments 10F21 and 10F22, free segment 10F21 has a higher priority, since free segment 10F21 is shorter than free segment 10F22 in length. Among the rest four free segments, free segments 10F11 and 10F12 have a higher priority than free segments 10F31 and 10F32, free segments 10F31 and 10F32, since free segments 10F11 and 10F12 are located on M1 layer which is lower than M3 layer where free segments 10F31 and 10F32 are located. In addition, between free segments 10F11 and 10F12, free segment 10F11 has a higher priority, since free segment 10F11 is shorter than free segment 10F12 in length. Likewise, between free segments 10F31 and 10F32, free segment 10F31 has a higher priority, since free segment 10F31 is shorter than free segment 10F32 in length.

With the extra delay(s) budgeted (i.e., block 520 of process 500 of FIG. 5) and available free segments 630 extracted (i.e., block 530 of process 500), free segment allocation (i.e., block 540 of process 500) may subsequently be conducted. That is, some of available free segments 630 may be chosen, based on extra delays of all-scenario hold-time budgeting 620, to form compensation stub(s) (such as those shown in layout 420 of FIG. 4) for each of the hold-time violating nets. LUTs of super corner MSD model 610, generated by block 510 of process 500, are referred to for picking the free segments of the right lengths or sizes that would yield the extra delays dictated by all-scenario hold-time budgeting 620.

The process of free segment allocation described above may be illustrated by the following example: According to all-scenario hold-time budgeting of FIG. 8, net N1 of IC 810 is required to add an extra delay of 6 ps. Assume that net N1 of IC 810 comprises metal segment 10M2 (a M2 segment) of FIG. 10. Also assume that free segment extraction of FIG. 9 indicates that free segments 10F21, 10F22, 10F31 and 10F32 of FIG. 10 are available for being utilized to construct one or more compensation stubs that may contribute the 6 ps required. Further assume that driving device 84 of FIG. 8 has a DS rating of 1×. Hence, super corner LUT 73(1) of MSD model 74 of FIG. 7 may then be referred to and construct a compensation stub using one or more of free segments 10F21, 10F22, 10F31 and 10F32 of FIG. 10 with a suitable metal length. For example, free segment 10F21 may be utilized as a compensation stub which may be connected to metal segment 10M2 by simply extending metal segment 10M2 to merge with free metal segment 10F21. Apparently, a whole length of free metal segment 10F21, as shown in FIG. 10, is not needed, because LUT 73(1) of FIG. 7 characterizes that a unit length of M2 segment would contribute 15.2 ps of delay, while the needed extra delay at N1 net of IC 810 is merely 6 ps. It follows that a portion of free metal segment 10F21, of about 0.4-unit length, may be used as a compensation stub, which may contribute the required 6 ps extra delay to net N1 of IC 810 by extending metal segment 10M2 to connect a piece of M2 metal of 0.4 units long at the location of free metal segment 10F21 as shown in FIG. 10.

Hold-Time Compliant Signal Transmission

Figure 11:
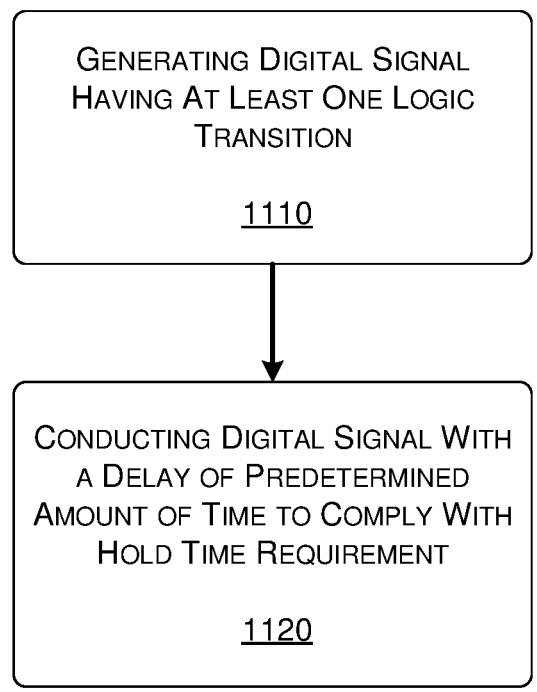
FIG. 11 is a flowchart of an example process of transmitting a digital signal within an IC with a compliance to a hold-time requirement in accordance with an implementation of the present disclosure.

FIG. 11 is a flowchart depicting a process 1100 for transmitting a digital signal within an IC from a first sequential-logic device to a second sequential-logic device, with a compliance to a hold-time requirement at an input terminal of the second sequential-logic device. Process 1100 may begin at 1110.

At 1110, the process may involve the first sequential-logic device generating a digital signal. The digital signal may have at least one logic transition. For example, the first and second sequential-logic devices may be D flip-flops 11 and 12, respectively, of FIG. 1. The digital signal may be the data generated by D flip-flop 11, and may have at least one logic transition, transitioning either from logic '0' to logic '1' (such as edge ED3 of waveform 333 as shown in FIG. 1) or from logic '1' to logic '0' (such as edge EC2 of waveform 550 as shown in FIG. 1). Process 1100 may proceed from 1110 to 1120.

At 1120, the process may involve one or more delay elements conducting the digital signal from the first sequential-logic device to the second sequential-logic device with a delay of a predetermined amount of time. The one or more delay elements may be disposed between the first sequential-logic device and the second sequential-logic device. Due to the delay of the predetermined value, the at least one logic transition may comply with the hold-time requirement when the digital signal arrives at the input terminal of the second sequential-logic device. For example, the delay element may be net 13 of FIG. 1 that connects D flip-flops 11 and 12 thereof. Net 13 may conduct the data generated by D flip-flop 11 from D flip-flop 11 to D flip-flop 12 with the delay. Use waveforms in timing diagram 120 of FIG. 1 as an example. Without the delay provided by net 13, the data generated by D flip-flop 11 might have arrived at the D terminal of D flip-flop 12 as waveform 333, violating the hold-time requirement at the D terminal of D flip-flop 12 for the reason explained in an earlier part of the present application. Thanks to the delay provided by net 13, however, the data may actually arrive at the D terminal of D flip-flop 12 as waveform 332. As shown in FIG. 1, the delay enables the transition of the data to move from edge ED3 of waveform 333 to edge ED2 of waveform 332, arriving after edge EC1 of the clock signal (i.e., waveform 550) by at least an amount of hold time $T_{hd}$ and thereby complying with the hold-time requirement by having a positive hold-time margin. That is, net 13 provides the delay of a predetermined amount of time, the predetermined amount of time being the time difference between edges DE3 and DE2 of diagram 120 of FIG. 1. Namely, transition ED2 of the data arrives at D flip-flop 12 later than the clock transition (i.e., transition EC1 of clock signal of waveform 550) by at least a hold time of D flip-flop 12 (i.e., hold time $T_{hd}$).

In some embodiments, net 13 is a passive delay element that includes an electrically-conductive primary wiring, such as the primary wiring of net 43 as shown in layout 410 of FIG. 4. The primary wiring of net 43 may carry the digital signal from the Q terminal of D flip-flop 11 to D terminal of D flip-flop 11. Net 13 also includes at least one electrically-conductive compensation stub, such as those shown in layout 420 of FIG. 4. Each electrically-conductive compensation stub may extend from the primary wiring and terminate in one of one or more metal layers of the IC without connecting to an active device of the IC, also as shown in layout 420 of FIG. 4. Each of the electrically-conductive primary wiring and the at least one electrically-conductive compensation stub may include a metal segment, a polysilicon segment, a via, a stacked via, or any combination thereof, as mentioned above.

In some embodiments, the one or more delay elements disposed between the first sequential-logic device and a second sequential-logic device may also include an active delay element (e.g. an inverter, or multiple inverters connected in series) connected in series with the passive delay element and located between the first and second sequential-logic devices.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. An integrated circuit (IC), comprising:
a monolithic semiconductor substrate;
a first device disposed on the monolithic semiconductor substrate;
a second device disposed on the monolithic semiconductor substrate; and
an electrical node electrically connecting the first device and the second device, the electrical node comprising one or more electrically-conductive elements that contribute to a total capacitance at the electrical node,
wherein the total capacitance at the electrical node fulfills a hold-time requirement at the electrical node,
wherein a first subset of the one or more electrically-conductive elements comprises a primary wiring that electrically couples the first device to the second device, the primary wiring having a first end connected to an output terminal of the first device and a second end connected to an input terminal of the second device,
wherein a second subset of the one or more electrically-conductive elements comprises at least one compensation stub having a fixed end and a free end,
wherein the at least one compensation stub is electrically coupled to the primary wiring through the fixed end,
wherein the free end is not electrically coupled to any electrical node of the IC,
wherein the at least one compensation stub is electrically coupled to the primary wiring by having the fixed end connected to a joint location of the primary wiring, and
wherein the joint location and the fixed end are arranged according to one of:
a first arrangement in which the joint location is located on a same metal layer of the IC as the fixed end is located and the fixed end is connected to the joint location in-situ on the same metal layer,
a second arrangement in which the joint location is located on a first electrically-conductive layer of the IC, the fixed end is located on a second electrically-conductive layer of the IC adjacent to the first electrically-conductive layer, and the fixed end is connected to the joint location through one or more vias between the first and second electrically-conductive layers, and
a third arrangement in which the joint location is located on a first metal layer of the IC, the fixed end is located on a second metal layer of the IC different than the first metal layer, and the fixed end is connected to the joint location through one or more vias or stacked vias between the first and second metal layers.

2. The IC of claim 1, wherein, during operation, the electrical node carries a time-varying digital signal having at least one logic transition.

3. The IC of claim 1, wherein:
the first device comprises either a first sequential-logic device or the first sequential-logic device followed by one or more first combinational-logic gates,
the second device comprises either a second sequential-logic device or the second sequential-logic device preceded by one or more second combinational-logic gates, and
the first sequential-logic device and the second sequential-logic device are clocked in synchronization.

4. The IC of claim 1, wherein:
the at least one compensation stub contributes a compensation capacitance as a part of the total capacitance at the electrical node, and
the hold-time requirement is not fulfilled without the compensation capacitance.

5. The IC of claim 1, wherein each of the first and second devices comprises a sequential-logic device, the IC further comprising:
one or more combinational-logic gates inserted between the first end of the primary wiring and the output terminal of the first sequential-logic device; or
one or more combinational-logic gates inserted between the second end of the primary wiring and the input terminal of the second sequential-logic device.

6. The IC of claim 1, wherein:
the first device comprises a first D flip-flop,
the second device comprises a second D flip-flop,
the output terminal of the first device comprises a Q terminal of the first D flip-flop, and
the input terminal of the second device comprises a D terminal of the second D flip-flop.

7. The IC of claim 1, wherein the one or more electrically-conductive elements comprise at least one metal segment, at least one polysilicon segment, at least one via, at least one stacked via, or any combination thereof.

8. The IC of claim 1, wherein the one or more electrically-conductive elements comprise a metal segment on one of one or more metal layers of the IC, the metal segment routed in a preferred routing direction of the one of the one or more metal layers, a non-preferred routing direction substantially orthogonal to the preferred routing direction, or a combination of both directions.

9. The IC of claim 1, wherein the one or more electrically-conductive elements comprise a metal segment on one of one or more metal layers of the IC, the metal segment having a width equal to an allowed minimum line width of the one of the one or more metal layers.

10. The IC of claim 1, wherein the one or more electrically-conductive elements comprise at least two metal segments located on at least two metal layers of the IC.

11. The IC of claim 1, wherein the value of the total capacitance at the electrical node further fulfills a transition requirement at the electrical node.

* * * * *